United States Patent
Kwon

(10) Patent No.: US 7,172,944 B2
(45) Date of Patent: Feb. 6, 2007

(54) METHOD OF FABRICATING A SEMICONDUCTOR DEVICE HAVING AN ELEVATED SOURCE/DRAIN

(75) Inventor: Hyung-Shin Kwon, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/282,156

(22) Filed: Nov. 18, 2005

(65) Prior Publication Data

US 2006/0079060 A1    Apr. 13, 2006

Related U.S. Application Data

(62) Division of application No. 10/206,809, filed on Jul. 26, 2002, now Pat. No. 7,002,223.

(30) Foreign Application Priority Data

Jul. 27, 2001  (KR) ............................. 2001-45397
Jun. 18, 2002  (KR) ............................. 2002-33981

(51) Int. Cl.
*H01L 21/336* (2006.01)
(52) U.S. Cl. ..................... 438/304; 438/300
(58) Field of Classification Search ............ 438/300, 438/304
See application file for complete search history.

(56) References Cited

U.S. PATENT DOCUMENTS

| 5,290,720 | A | 3/1994 | Chen |
| 5,545,579 | A | 8/1996 | Liang et al. |
| 5,650,340 | A | 7/1997 | Burr et al. |
| 5,817,562 | A | 10/1998 | Cheng et al. |
| 6,137,149 | A | 10/2000 | Kodama |
| 6,391,732 | B1 | 5/2002 | Gupta et al. |

FOREIGN PATENT DOCUMENTS

| JP | 10-012879 | 1/1998 |
| JP | 2000-269495 | 9/2000 |

OTHER PUBLICATIONS

English language abstract of Japanese Publication No. 10-012879.
English language abstract of Japanese Publication No. 2000-269495.

*Primary Examiner*—Howard Weiss
(74) *Attorney, Agent, or Firm*—Marger Johnson & McCollom, P.C.

(57) ABSTRACT

The present invention provides a semiconductor device having an elevated source/drain and a method of fabricating the same. In the semiconductor device, an active region is defined at a predetermined region of a semiconductor substrate and a gate electrode is formed to cross over the active region. First and second insulating layer patterns are sequentially stacked on sidewalls of the gate electrode, and a silicon epitaxial layer adjacent to edges of the first and second insulating layer patterns is formed on the active region. The edge of the first insulating layer pattern is protruded from the edge of the second insulating layer pattern to be covered with the silicon epitaxial layer whose predetermined region is silicided. Further, the method includes defining an active region a semiconductor substrate, forming a gate electrode crossing over the active region, sequentially stacking first and second insulating layer patterns an active region adjacent to opposite sides of the gate electrode, forming a silicon epitaxial layer on the active region to be adjacent to edges of the first and second insulating layer patterns, and siliciding at least a part of the silicon epitaxial layer. The edge of the first insulating layer pattern contacting the active region is protruded from the edge of the second insulating layer pattern, and the silicon epitaxial layer covers the protruded edge of the first insulating layer pattern.

50 Claims, 19 Drawing Sheets

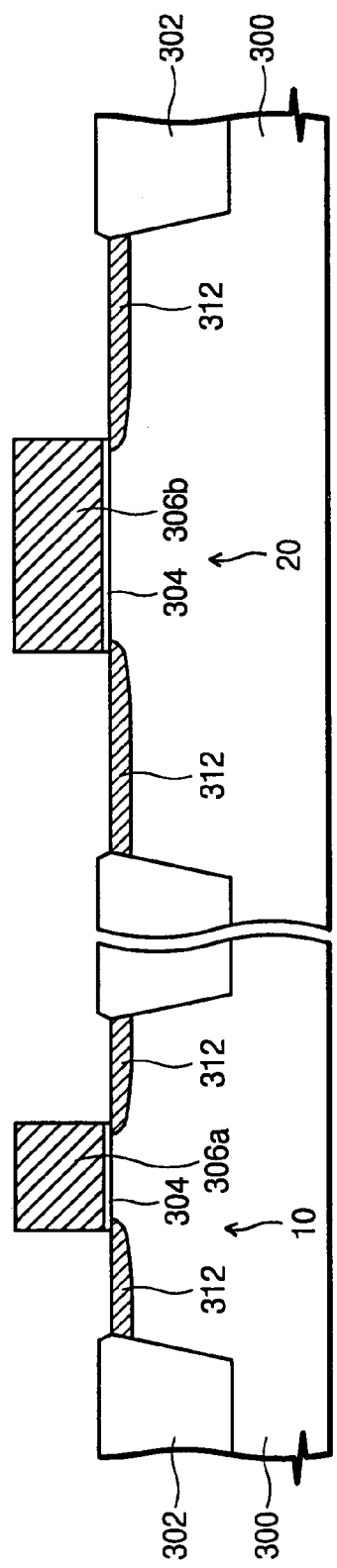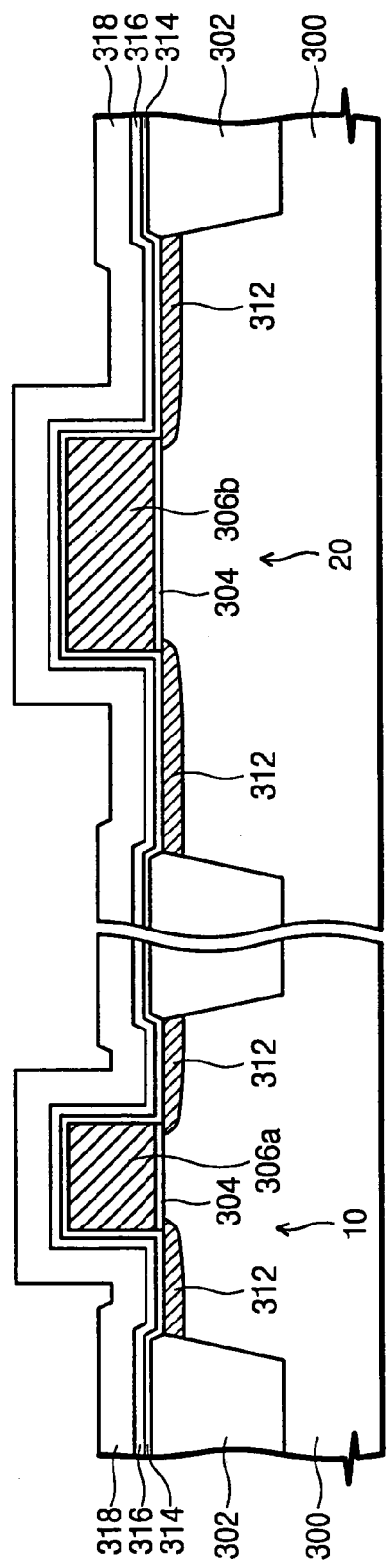

METHOD OF FABRICATING A SEMICONDUCTOR DEVICE HAVING AN ELEVATED SOURCE/DRAIN

RELATED APPLICATION

This application is a divisional of U.S. patent application Ser. No. 10/206,809, filed Jul. 26, 2002, now U.S. Pat. No. 7,002,223, which claims priority from Korean Patent Application Nos. 2001-45397, filed on Jul. 27, 2001 and 2002-33981, filed on Jun. 18, 2002, the contents of which are incorporated by reference.

FIELD OF THE INVENTION

The present invention relates to a semiconductor device and a method of fabricating the same. More specifically, the present invention is directed to a semiconductor device having an elevated source/drain and a method of fabricating the same.

BACKGROUND OF THE INVENTION

As semiconductor devices are continuously scaled down, the effective channel length of a gate becomes smaller. This may cause a punchthrough and a short channel effect at a transistor. In order to overcome these problems, an elevated source/drain has been suggested. The elevated source/drain is formed using a selective epitaxial growth (SEG) process to be higher than a surface of a semiconductor substrate. Thus, the short channel effect and the punchthrough can be prevented by forming a source/drain region having a shallow impurity-diffusing layer in the semiconductor substrate. Further, a silicide layer is formed by siliciding a silicon epitaxial layer to lower contact resistance and improve conductivity.

Unfortunately, the elevated source/drain suffers from the problems as follows:

First, the silicon epitaxial layer grows on the surface of the semiconductor substrate along a regular direction. Thus, a facet is formed in which an edge of the silicon epitaxial layer becomes thin. While siliciding the silicon epitaxial layer, a semiconductor substrate below a relatively thin facet is silicided to form a silicide layer deeply toward an inside of the semiconductor substrate at the edge of a source/drain region. As a result, an electric field is concentrated on the edge of the source/drain region which allows a leakage current to flow into the semiconductor substrate.

Second, a transistor connected to input and output terminals of a semiconductor component may be subjected to an electric shock caused by electrostatic discharge (ESD). Therefore, an ESD protection circuit is constructed at the input and output terminals. The ESD protection circuit includes transistors having a resistance to a high current and a high voltage. Because a silicide layer formed at a source/drain region of these transistors is close to a gate electrode, local thermal damage occurs at a transistor junction, which can destroy the transistors. In order to achieve a ballasting effect, the silicide layer is disposed a predetermined distance apart from the gate electrode to prevent the destruction of the transistors.

FIG. 1 through FIG. 4 are cross-sectional views for explaining the problems of the prior art.

Referring to FIG. 1, a device isolation layer 102 is disposed at a predetermined region of a semiconductor substrate 100 to define an active region. A gate pattern 110 is formed at the active region, and includes a gate oxide layer 104, a gate electrode 106, and a gate capping insulating layer 108 that are sequentially stacked. Impurities are implanted into the active regions adjacent to opposite sides of the gate electrode to form a lightly doped diffusion layer 112.

Referring to FIG. 2, first and second insulating layers are sequentially, conformally formed on an entire surface of the resultant structure. The second insulating layer, the first insulating layer, and the gate capping insulating layer 108 are sequentially, anisotropically etched to form a first insulating layer pattern 114 and a second insulating layer pattern 116 that sequentially cover the sidewall of the gate electrode 106.

Referring to FIG. 3, using the gate electrode 106, the first insulating layer pattern 114, and the second insulating layer pattern 116 as an ion implanting mask, impurities are implanted into the active regions adjacent to opposite sides of the gate electrode 106 to form a heavily doped diffusion layer 120. As a result, LDD-type source/drain regions 127 are formed in the active regions adjacent opposite sides of the gate electrode 106. A silicon epitaxial layer 118 is grown on a top surface of the gate electrode 106 and on a semiconductor substrate 100 exposed at the sides of the gate electrode 106, A facet 119 is formed at an edge of the epitaxial layer 118 adjacent to the device isolation layer 102 or the first insulating layer.

Referring to FIG. 4, the silicon epitaxial layer 118 is silicided to form a gate silicide layer 118a and a source/drain silicide layer 118b on the gate electrode 106 and the source/drain region 127, respectively. Because of the facet 119 formed at the edge of the silicon epitaxial layer 118, the edge of the source/drain silicide layer 118b has a protrusion 122 that is protruded inwardly toward a semiconductor substrate 100 adjacent to the first insulating layer 114. When a voltage is applied at the source/drain region 127, an electric field is concentrated on the protrusion 122, which allows a leakage current to flow into the semiconductor substrate 100 from the source/drain region 127. The leakage current can deteriorate characteristics of a semiconductor device and interrupt normal operations thereof. A way of preventing the formation of the protrusion 122 is to form the silicon epitaxial layer 118 thickly. Generally, a silicon epitaxial layer is grown by sputtering. So, while growing the silicon epitaxial layer 118, silicon particles can attach to an external sidewall of the second insulating layer pattern 116. Following a silicidation process, the silicon particles can undesirably electrically connect the gate silicide layer 118a to the source/drain silicide layer 118b. This problem becomes worse with increase in thickness of the silicon epitaxial layer 118.

SUMMARY OF THE INVENTION

A feature of the present invention is to provide a semiconductor device having a silicide layer with a planar side contacting a source/drain region and a method of fabricating the same.

Another feature of the invention is to provide a semiconductor device having low source/drain and gate resistances, and a method of fabricating the same.

Still another feature of the invention is to provide a semiconductor device which uniformly distributes the heat created at a transistor to prevent the transistor from being destroyed by thermal damage, and a method of fabricating the same.

In order to achieve these features, the present invention provides a semiconductor device having an elevated source/drain. The semiconductor device includes an active region defined at a semiconductor substrate and a gate electrode crossing over the active region. First and second insulating layer patterns are sequentially stacked on sidewalls of the gate electrode. An edge of the first insulating layer pattern is protruded from an edge of the second insulating layer pattern to be covered with the silicon epitaxial layer. A predetermined region of the silicon epitaxial layer is silicided.

According to an aspect of the present invention, the first and second insulating layer patterns may have an L-shaped structure. Each of the L-shaped first and second insulating layer patterns has a vertical portion and a horizontal portion. The vertical portion of the L-shaped first insulating layer is formed on a sidewall of the gate electrode, and the horizontal portion thereof is extended from the vertical portion to be formed on the active region. The L-shaped second insulating layer pattern is formed on the first insulating layer pattern according to a shape of the first insulating layer pattern. A vertical portion edge of the L-shaped first insulating layer pattern is protruded from a horizontal portion edge of the L-shaped second insulating layer pattern to cover a source/drain silicide layer.

According to another aspect of the present invention, the semiconductor device further includes a barrier insulating layer pattern which conformally covers the L-shaped first and second insulating layers as well as the predetermined region of the silicon epitaxial layer. In this case, a silicon epitaxial layer exposed by the side of a sidewall insulating layer is silicided.

In still another aspect of the present invention, a sidewall insulating layer pattern is formed on the sidewalls of the gate electrode. The first and second insulating layer patterns are sequentially stacked on the sidewall insulating layer and the predetermined region of the active region to conformally cover them. A source/drain silicide layer adjacent to the first and second insulating layer patterns is formed on the active region. The source/drain silicide layer is a silicided silicon epitaxial layer.

In order to achieve these features, the present invention provides a method of fabricating a semiconductor device having an elevated source/drain. The method comprises defining an active region at a semiconductor substrate and forming a gate electrode to intersect the active region. First and second insulating layer patterns are sequentially stacked on an active region adjacent to opposite sides of the gate electrode. A silicon epitaxial layer adjacent to edges of the first an second insulating layer patterns is formed on the active region. The edge of the first insulating layer, contacting the active region, is formed to be protruded from the edge of the second insulating layer pattern. The silicon epitaxial layer is formed to cover the protruded edge of the first insulating layer pattern. At least one part of the silicon epitaxial layer is then silicided.

In the present invention, the first and second insulating layer patterns may have an L-shaped structure. A silicon epitaxial layer is selectively grown on an active region adjacent to the L-shaped first and second insulating layer patterns and on the gate electrode. The silicon epitaxial layer is silicided to form a gate silicide layer covering a top surface of the gate electrode and a source/drain silicide layer covering the active region.

More specifically, in order to form the L-shaped first and second insulating layer patterns, first, second, and third insulating layers are sequentially formed on an entire surface of a semiconductor substrate where a gate electrode is formed. Preferably, the second and third insulating layers have an etch selectivity with respect to the first insulating layer. Preferably, the second insulating layer has somewhat of an etch selectivity with respect to the third insulating layer. The third, second, and first insulating layers are sequentially, anisotropically etched to form first, second, and third insulating layer patterns that are sequentially stacked. Each of the first and second insulating layer patterns has an L-shaped structure that is comprised of a vertical portion and a horizontal portion. The vertical portions of the first and second L-shaped insulating layers are sequentially stacked on a sidewall of the gate electrode, and the horizontal portions thereof are sequentially stacked on the active region. The third insulating layer pattern is formed on the L-shaped second insulating layer and has a curved sidewall. The third insulating layer is isotropically etched to expose the second insulating layer pattern. Although the second insulating layer pattern has an etch selectivity with respect to the third insulating layer, edges of the vertical and horizontal portions of the second insulating layer pattern are partially etched during the isotropical etching. Thus, the edge of the horizontal portion of the first insulating layer is protruded outwardly toward the second insulating layer pattern.

Alternatively, the method further comprises growing the silicon epitaxial layer and sequentially stacking first and second barrier insulating layer patterns to conformally cover the L-shaped first and second insulating layer patterns and a part of the silicon epitaxial layer. The L-shaped first and second insulating layer patterns prevent silicidation of the silicon epitaxial layer, so that the source/drain silicide layer is aligned which the edges of the first and second barrier insulating layer patterns to be formed on the active region.

Alternatively, a method of fabricating a semiconductor device comprises forming a gate insulating layer to intersect an active region and forming a sidewall insulating layer pattern on a sidewall of a gate electrode. First and second barrier insulating layer patterns are sequentially stacked on the sidewall insulating layer pattern and a predetermined region of the active region to conformally cover the sidewall insulating layer pattern and the active region. An edge of the first barrier insulating layer pattern is formed to be protruded from an edge of the second barrier insulating layer pattern. A silicon epitaxial layer is grown on the gate electrode and the active region that are exposed to both sides of the barrier insulating layer. Thereafter, the silicon epitaxial layer is silicided to form a source/drain silicide layer. The silicon epitaxial layer is grown to cover the edge of the protruded first insulating layer pattern, and the source/drain silicide layer is formed to be adjacent to the edges of the first and second insulating layer patterns.

BRIEF DESCRIPTION OF THE DRAWINGS

FIG. 13 through FIG. 20 are cross-sectional views illustrating a method of fabricating a semiconductor device according to the second embodiment of the present invention.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those of ordinary skill in the art. In the attached figures, the thickness of layers and regions is exaggerated for clarity. Moreover, when it is mentioned that a layer is on another layer or on a substrate, the layer may be directly formed on another layer or on a substrate, or a third layer may be interposed therebetween. The same reference numbers indicate the same components throughout the specification.

Figure 5:
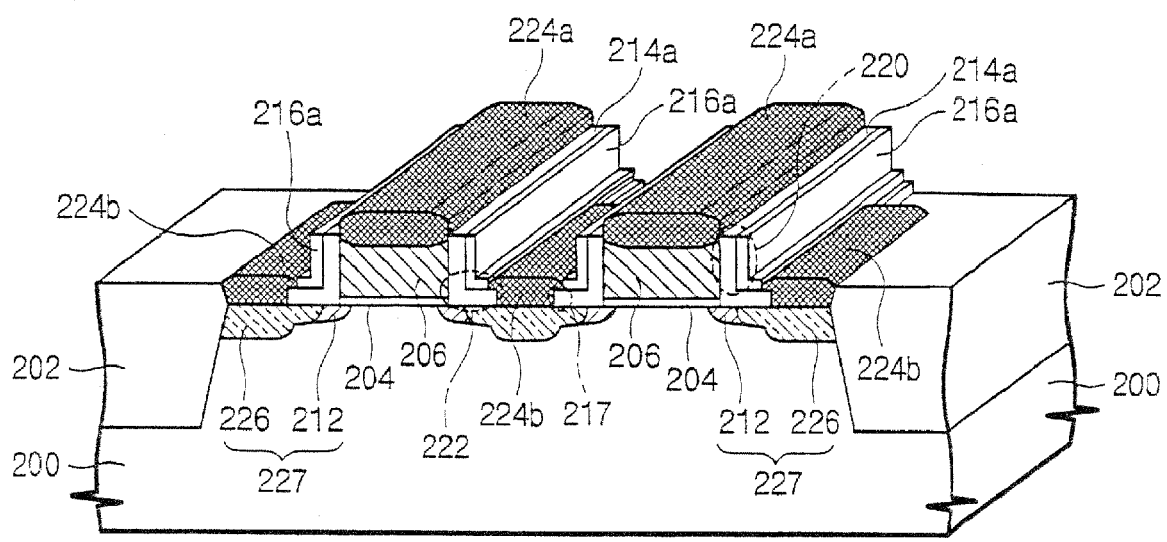
FIG. 5 is an isometric view illustrating a construction of a semiconductor device according to a first embodiment of the present invention.

Referring to FIG. 5, a device isolation layer 202 is disposed at a predetermined region of a semiconductor substrate 200 to define an active region. A gate electrode 206 crosses the active region, and a gate oxide layer 204 is interposed between the gate electrode 206 and the active region. A first insulating layer pattern 214a and a second insulating layer pattern 216a sequentially cover a sidewall of the gate electrode 206. Each of the first and second insulating layer patterns 214a and 216a has a vertical portion 220 and a horizontal portion 222. The vertical portion 220 sequentially covers the sidewall of the gate electrode 206 and the horizontal portion 222 sequentially covers the semiconductor substrate. Thus, the first and second insulating layer patterns 214a and 216a have L-shaped sections across the gate pattern 210. In the horizontal portion 222, the first insulating layer pattern 214a has a protrusion 217 extended outwardly toward the second insulating layer pattern 216a. A gate silicide layer 224a is disposed on the gate electrode 206, and a source/drain silicide layer 224b is disposed on an active region adjacent one side of the first insulating layer pattern 216a. The source/drain silicide layer 224b covers the protrusion 217 of the first insulating layer pattern 214a. Thus, the source/drain silicide layer 224b has a structure in which a top surface is wider than a bottom surface contacting the semiconductor substrate 200. Source/drain regions 227 are formed in active regions adjacent to opposite sides of the gate pattern 210. The source/drain region 227 may have, for example, an LDD structure. That is, the source/drain region 227 may include a lightly doped diffusion layer 212 and a heavily doped diffusion layer 226. The lightly doped diffusion layer 212 is disposed below the edge of the gate oxide layer 204 and the vertical portions 220 of the first and second insulating layer patterns 214a and 216a. The heavily doped diffusion layer 226 is disposed below the horizontal portions 222 of the first and second insulating layer patterns 214a and 216a and the source/drain silicide layer 224b. The heavily doped diffusion layer 226 is deeply formed below the source/drain silicide layer 224b, and is shallowly formed below the first and second insulating layer patterns 214a and 216a.

Figure 1:
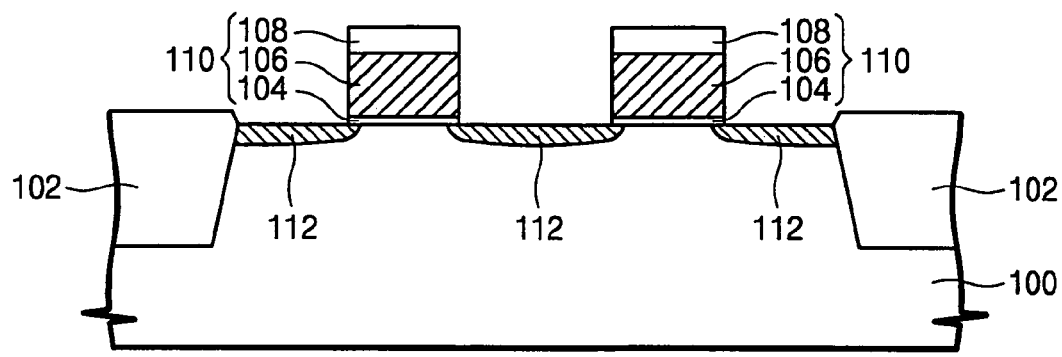
FIG. 1 through FIG. 4 are cross-sectional views for explaining problems according to a prior art.
Figure 2:
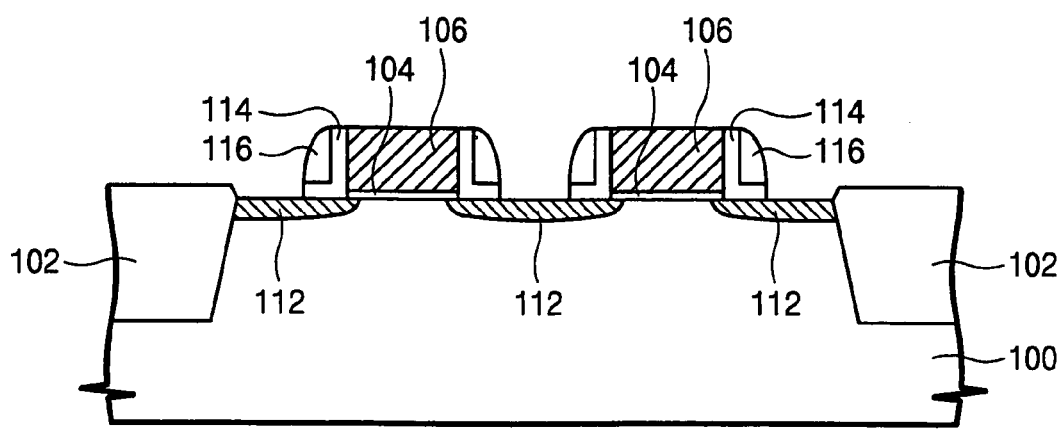
Figure 3:
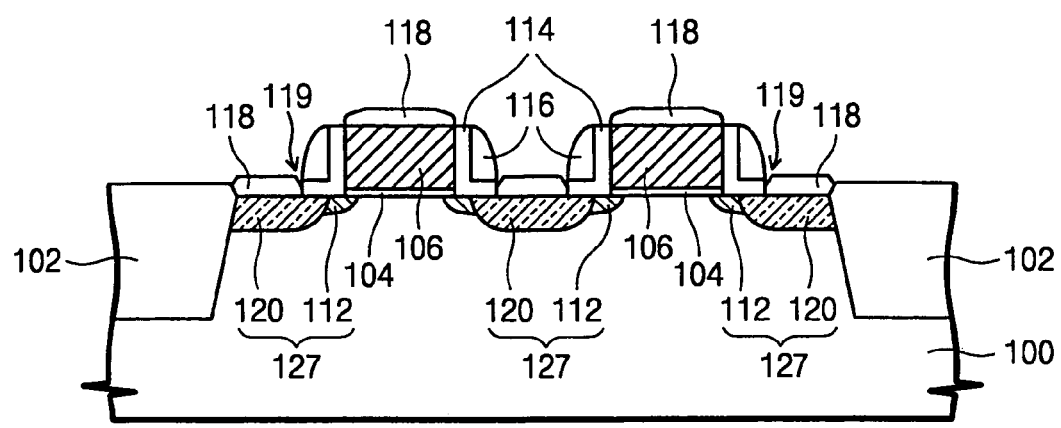
Figure 4:
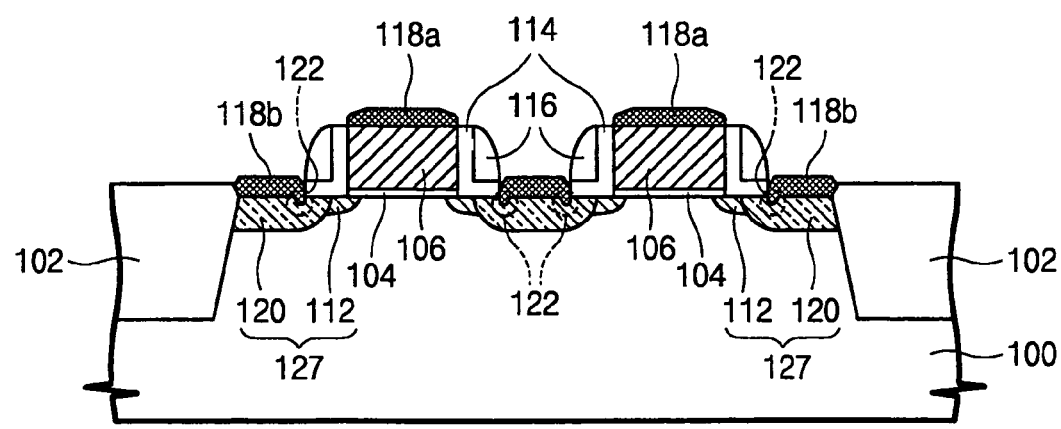

As shown in FIG. 5, unlike the case of a prior art, the source/drain silicide layer 224b does not have a protrusion (122 of FIG. 4) at its edge. In other words, the source/drain silicide layer 224b planarly contacts the semiconductor substrate 200. Therefore, when a voltage is applied to the source/drain, the concentration of an electric field is suppressed to prevent a leakage current flowing into a semiconductor and to obtain stable operation characteristics of a device.

A method of fabricating a semiconductor device according to a first embodiment of the present invention is described below with reference to FIG. 6 through FIG. 11.

Figure 6:
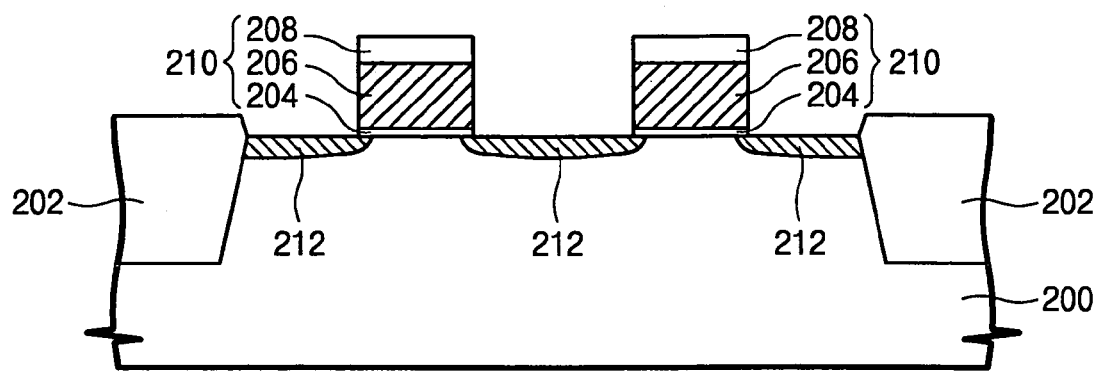
FIG. 6 through FIG. 11 are cross-sectional views illustrating a method of fabricating a semiconductor device according to the first embodiment of the present invention.

Referring to FIG. 6, a device isolation layer 202 is formed at a predetermined region of a semiconductor substrate 200 to define an active region. A gate pattern 210 is formed to intersect the active region. The gate pattern 210 includes the gate electrode 206 crossing the active region and a gate oxide layer 204 interposed between the gate electrode 206 and the active region. The gate pattern 210 may further include a gate capping insulating layer 208 on the gate electrode 206. Preferably, the gate oxide layer 204 is made of silicon oxide. Impurities are implanted into the active regions adjacent opposite sides of the gate pattern 210 to form a lightly doped diffusion layer 212.

Figure 7:
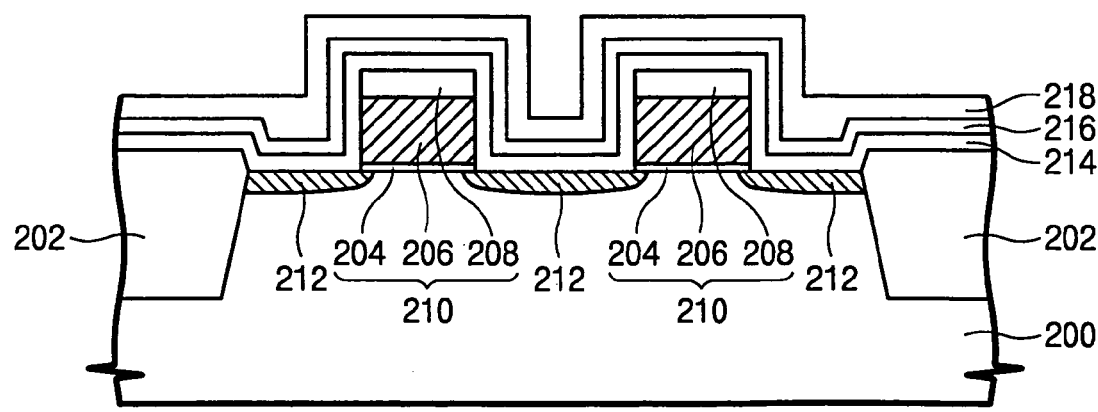

Referring to FIG. 7, first to third insulating layers 214, 216, and 218 are sequentially, conformally formed over an entire surface of the resultant structure where the lightly doped diffusion layer 212 is formed. Preferably, the first insulating layer 214 is made of the material having an etch selectivity with respect to the second and third insulating layers 216 and 218. For example, the first insulating layer 214 is made of silicon oxide to a thickness of 100 to 500 Å. And preferably, the second and third insulating layers 216 and 218 are made of silicon nitride or silicon oxynitride. In a case where the second insulating layer 216 and the third insulating layer 218 are all made of silicon nitride, the second insulating layer 216 is made of high temperature nitride (HTN) at a temperature of 770–850° C. under a pressure of 0.1–0.5 Torr, and the third insulating layer 218 is made of low temperature nitride (LTN) at a temperature of 660–700° C. and under a pressure of 1–100 Torr. Accordingly, the second and third insulating layers preferably have an etch selectivity with respect to each other. Alternatively, the second insulating layer 216 is made of silicon nitride, and the third insulating layer 218 is made of silicon oxynitride.

Figure 8:
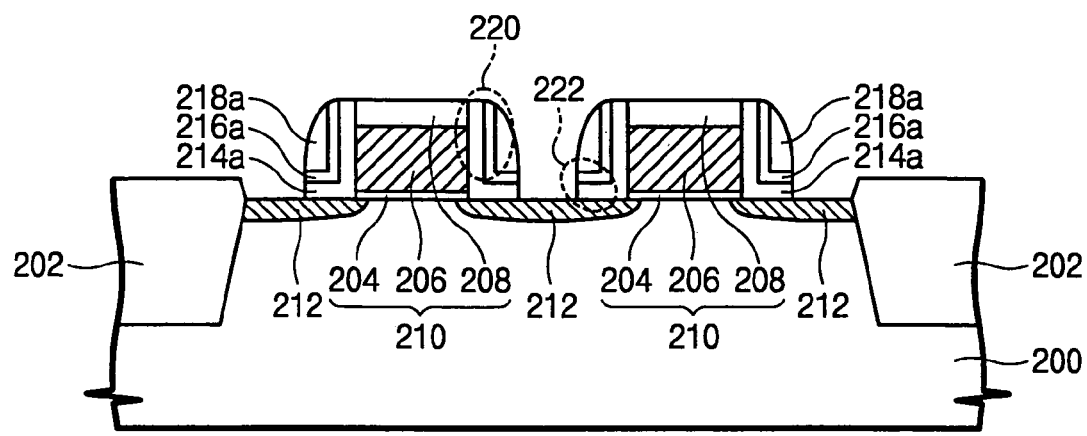

Referring to FIG. 8, the third insulating layer 218, the second insulating layer 216, and the first insulating layer 214 are sequentially, anisotropically etched to form a first insulating layer pattern 214a, a second insulating layer pattern 216a, and a third insulating layer pattern 218a that sequentially cover the sidewall of the gate pattern 210. The first and second insulating layer patterns 214a and 216a have L-shaped sections across the gate electrode 210. That is, the first and second insulating layer patterns 214a and 216a have vertical portions 220 covering the sidewall of the gate pattern 210. Also, the first and second insulating layer patterns 214a and 216a are extended across the gate pattern 210 from the bottom of the vertical portion 220 to have a horizontal portion 222 covering the active region. The third insulating layer pattern 218a has the shape of a spacer covering the top surface of the horizontal portion 222 and the sidewall of the vertical portion 220.

Figure 9:
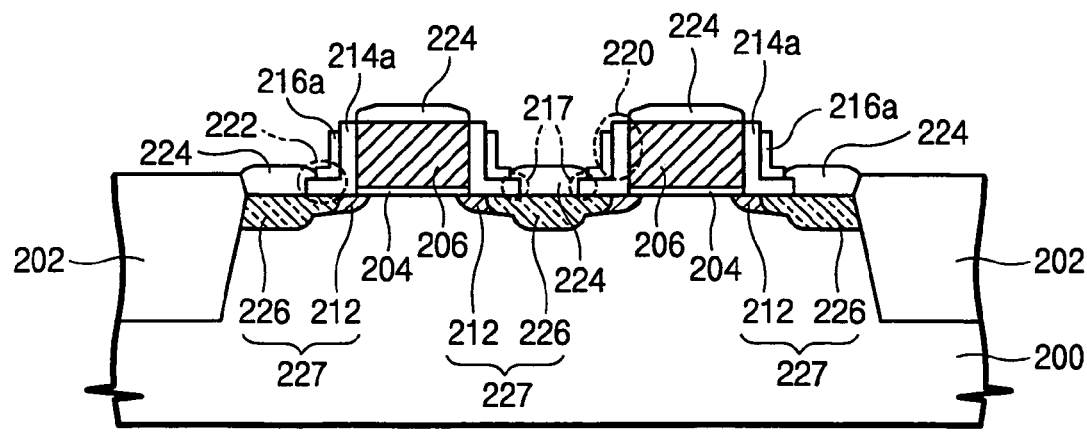

Referring to FIG. 9, the third insulating layer pattern 218a and the gate capping insulating layer 208 are isotropically etched to expose the gate electrode 206 and the first and second insulating layer patterns 214a and 216a that sequentially cover the sidewall of the gate electrode 206. Preferably, the third insulating layer pattern 218a is isotropically etched using a phosphoric acid solution. While the third insulating layer pattern 218a is etched, the second insulating layer pattern 216a at the edges of the vertical and horizontal portions 220 and 222 is also etched. As a result, the first insulating layer pattern 214a is protruded outwardly toward the second insulating layer pattern 216a at the edges of the vertical and horizontal portions 220 and 222. A selective epitaxial growth (SEG) process is then performed to the semiconductor substrate where the third insulating layer pattern 218a is removed, growing a silicon epitaxial layer 224 on the active region exposed to both sides of the gate electrode 206 and on the top surface of the gate electrode 206. As shown in FIG. 9, the silicon epitaxial layer 224 is formed to cover the top of a protrusion 217 of the first insulating layer pattern 214a protruded outwardly toward the second insulating layer pattern 216a at the edge of the horizontal portion 222. For example, in a case where the first insulating layer 214 is formed to a thickness of 100 Å, the silicon epitaxial layer 224 is preferably formed to a thickness of 300 Å.

Prior to formation of the silicon epitaxial layer 224, it is preferable to remove a native oxide layer formed at the surfaces of the exposed active region and the gate pattern 210. For example, following a thermal treatment process performed for a minute at a temperature of 900° C. while hydrogen is provided to the surface of the semiconductor substrate 200, the SEG process may be performed at once. Afterwards, impurities are implanted into the active regions adjacent to the opposite sides of the gate electrode 206 through the silicon epitaxial layer, the first insulating layer pattern 214a, and the second insulating layer patterns and 216a, forming a heavily doped diffusion layer 226. As a result, an LDD-structured source/drain 227 is formed in the active regions adjacent to the opposite sides of the gate electrode 206. The LDD-structured source/drain 227 includes a lightly doped diffusion layer 212 and a heavily doped diffusion layer 226.

The heavily doped diffusion layer 226 may be formed prior to formation of the silicon epitaxial layer 224. Since impurities are implanted through the horizontal portions of the first and second insulating layer patterns 214a and 216a, the heavily doped diffusion layer 226 below the first and second insulating layer patterns 214a and 216a is formed to be relatively shallow. Accordingly, the heavily doped diffusion layer 226 is shallowly formed below the horizontal portion 222 to suppress a punchthrough, and is deeply formed below the epitaxial layer 224 to reduce the resistance of the source/drain region 227.

Figure 10:
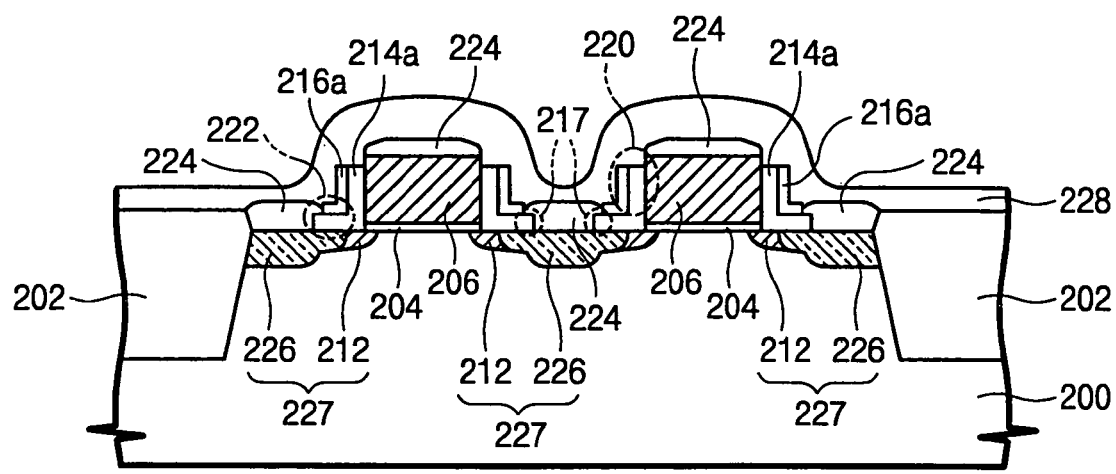
Figure 11:
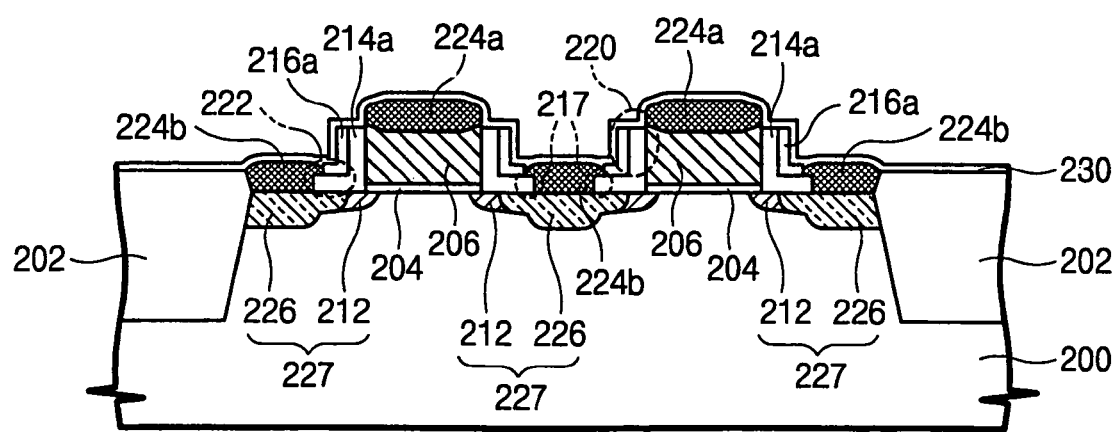

Referring to FIG. 10, a metal layer 228 is conformally formed at an entire surface of a semiconductor substrate where the silicon epitaxial layer 224 and the source/drain 227 are formed. Preferably, the metal layer 228 is made of a material that reacts on silicon in the silicon epitaxial layer 224 to form silicide. For example, the material maybe selected from the group consisting of nickel (Ni), cobalt (Co), and titanium (Ti). Preferably, the native oxide layer grown at the surface of the silicon epitaxial layer 224 is removed prior to formation of the metal layer 228. The native oxide layer is removed by means of an isotropic etching technique. During removal of the native oxide layer, the first insulating layer pattern 214a protruded upwardly toward the second insulating layer pattern 216a at the edge of the vertical portion 220 is also removed to expose an upper sidewall of the gate electrode 206.

A first annealing process is performed to a semiconductor substrate 200 where the metal layer 228 is formed, diffusing metal atoms constituting the metal layer 228 into the silicon epitaxial layer 224. Similarly, the metal atoms are diffused to the top of the gate electrode 206 through the sidewall of the exposed gate electrode 206. Preferably, the annealing process is performed at a temperature of 450–500° C. for about 45 seconds. Some of the diffused metal atoms bond with silicon to form a silicide, and the residuals thereof remain unbounded between silicon atoms. A remaining metal layer 228, which is not diffused into the epitaxial layer 224, is then removed. Preferably, the remaining metal layer 228 is removed by means of an isotropic etching technique using, for example, $H_2SO_4$.

A second annealing process is performed to a semiconductor substrate where the metal layer 228 is removed, completely siliciding the epitaxial layer 224. As a result, a gate silicide layer 224a and a source/drain silicide layer 224b are formed on the gate electrode 206 and the active regions adjacent to the opposite sides of the gate electrode 206, respectively. Preferably, the second annealing process is performed at a temperature of 800–900° C. for about 30 seconds.

Prior to the second annealing process, an etch-stop layer 230 may be formed over an entire surface of the semiconductor substrate where the metal layer 228 is removed. The etch-stop layer 230 prevents the silicide layer 224a from being overetched in a subsequent process for forming a contact hole. Also the etch-stop layer 230 acts uniformly to silicide the epitaxial layer 224 during the second annealing process. Preferably, the etch-stop layer 230 is made of silicon oxynitride. The protrusion 217 of the first insulating layer pattern 214a prevents the diffusion of the metal atoms during the first and second annealing processes. Due to the protrusion 217 of the first insulating layer 214a, metal diffused to the bottom of a facet formed at the edge of the epitaxial layer 224 is not diffused into the semiconductor substrate 200. As a result, the source/drain silicide layer 224b planarly contacts the semiconductor substrate 200 to reduce the concentration of an electric field remarkably as compared to the prior art.

Although not shown in the figures, using a conventional manner, an interlayer insulting film is formed over the entire surface of the semiconductor substrate 200 where the silicide layer 224a is formed, and interconnections are formed.

Figure 12:
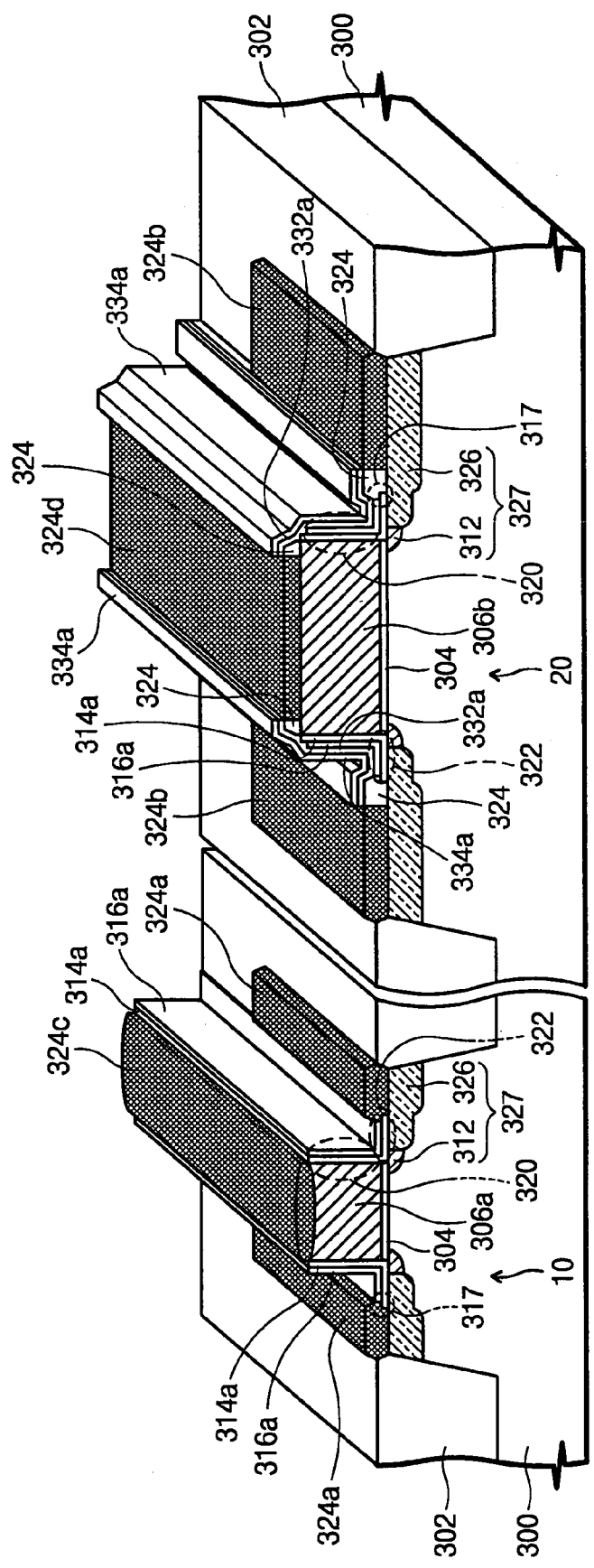
FIG. 12 is an isometric view illustrating a construction of a semiconductor device according to a second embodiment of the present invention.

An isometric view illustrating a construction of a semiconductor device according to a second embodiment of the present invention is shown in FIG. 12. Referring to FIG. 12, a device isolation layer 302 is formed at a predetermined region of a semiconductor substrate 300 to define first and second active regions 10 and 20. The first active region 10 is a region where a cell transistor of a memory device such as DRAM and SRAM or transistors of a peripheral circuit are formed. The second active region 20 is a region where a transistor used in an electrostatic discharge (ESD) protection circuit or the like is formed. First and second gate electrodes 306a and 306b cross over the first and second active regions 10 and 20, respectively. A gate oxide layer 304 is interposed between the first gate electrode 306a and the first active region 10 and between the second gate electrode 306b and the second active region 20. First and second insulating layer patterns 316a and 316b sequentially cover sidewalls of the first and second gate electrodes 306a and 306b. The first and second insulating layer patterns 314a and 316a have an L-shaped section that includes a vertical portion 320 and a horizontal portion 322. The vertical portion 320 is formed on the sidewalls of the first and second gate electrodes 306a and 306b, and the horizontal portion 322 is formed on the first active region 10 or the second active region 20.

A first gate silicide layer 324c is formed on the first gate electrode 306a. A first source/drain silicide layer 324a adjacent to lateral edges of the first and second insulating layer pattern 314a and 316a is formed on the first active region 10. A silicon epitaxial layer 324 is formed on the second gate electrode 306b. A silicon epitaxial layer 324 adjacent to side edges of the first and second insulating layer patterns 314a and 314b is formed on the second active region 20. First and second barrier insulating layer patterns 332a and 334a sequentially, conformally cover the L-shaped first and second insulating layer patterns 314a and 316a formed at both sides of the second gate electrode 306b. The first and second barrier insulating layer patterns 332a and 334a are laterally extended to cover a predetermined region of the silicon epitaxial layer 324. A second source/drain silicide layer 324b is formed on the second active region 20 to be aligned to the lateral edges of the first and second barrier insulating layer patterns 332a and 334a. The second source/drain silicide layer 324b is a silicided version of the silicon epitaxial layer 324. The predetermined region of the silicon epitaxial layer 324 formed on the second gate electrode 306b is silicided to form a second gate silicide layer 324d, which is disposed between the barrier insulating layer patterns formed at the both sides of the second gate electrode 306b.

A source/drain 327 adjacent to the first gate electrode 306a is formed in the first active region 10. On other hand, a source/drain 327 adjacent to the second gate electrode 306b is formed in the second active region 20. The source/drain 327 includes a lightly doped diffusion layer 312 formed below the horizontal portions 320 of the first and second insulating layer patterns 332a and 334a and a heavily doped diffusion layer 326 aligned to the sidewall of the second insulating layer pattern 334a. The heavily doped diffusion layer 326 may be shallowly formed below the horizontal portions 322 of the first and second insulating layer patterns 332a and 334a, and deeply formed below the source/drain silicide layers 324a and 324b. In other words, the source/drain 327 may have an LDD structure.

The first and second gate silicide layers 324c and 324d contact the first and second gate electrodes 306a and 306b, respectively. The first and second source/drain silicide layer 324a and 324b planarly contact the semiconductor substrates in the first and second active regions 10 and 20, respectively. The first source/drain silicide layer 324a is a silicided version of a silicon layer that is grown by means of a selective epitaxial growth (SEG) process. Because a facet of the silicon epitaxial layer grown on the first active region 10 is disposed on the L-shaped first insulating layer pattern 314a, the first source/drain silicide layer 324a may planarly contact the substrate of a semiconductor device. Because the second source/drain silicide layer 324b are aligned the lateral edges of the first and second barrier insulating layer patterns 332a and 332b, they may planarly contact the semiconductor substrate of the second active region 20.

A second embodiment of the present invention is described below with reference to FIG. 13 through FIG. 20.

Referring to FIG. 13, a device isolation layer 302 is formed at a predetermined region of a semiconductor substrate to define first and second active regions 10 and 20. The second active region 20 is a region where a transistor connected to an input/output terminal of a semiconductor device is to be formed. For example, transistors constituting an ESD protection circuit may be formed in the second active region 20. A first gate electrode 306a is formed to cross over the first active region 10, and a second gate electrode 306b is formed to cross over the second active region 20. A gate insulating layer 304 is interposed between the first gate electrode 306a and the first active region 10 and between the second gate electrode 306b and the second active region 20. A lightly doped diffusion layer 312 is formed at the first and second active regions 10 and 20, and is aligned to sidewalls of the first and second gate electrodes 306a and 306b. A gate capping insulating layer (not shown) may be further formed on the first and second gate electrodes 306a and 306b.

Referring to FIG. 14, first, second, and third insulating layers 314, 316, and 318 are sequentially, conformally formed over an entire surface of the resultant structure where the lightly doped diffusion layer 312 is formed. They may be formed the same as the first embodiment.

Figure 15:
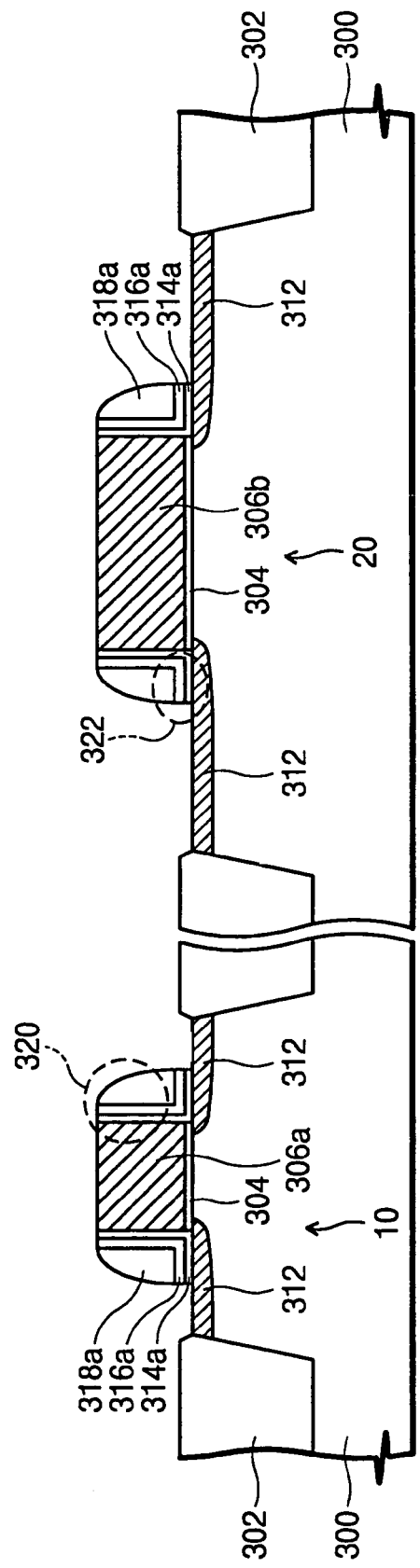

Referring to FIG. 15, the third, second, and first insulating layers 318, 316, and 314 are sequentially, anisotropically etched to form first, second, and third insulating layer patterns 314a, 316a, and 318a that are sequentially stacked on each sidewall of the first and second gate patterns 306a and 306b. Each of the patterns 314a and 316a has an L-shaped section including a vertical portion 320 and a horizontal portion 322. The vertical and horizontal portions 320 and 322 have the same shape as in the first embodiment. The third insulating layer pattern 318a has a curved sidewall.

Figure 16:
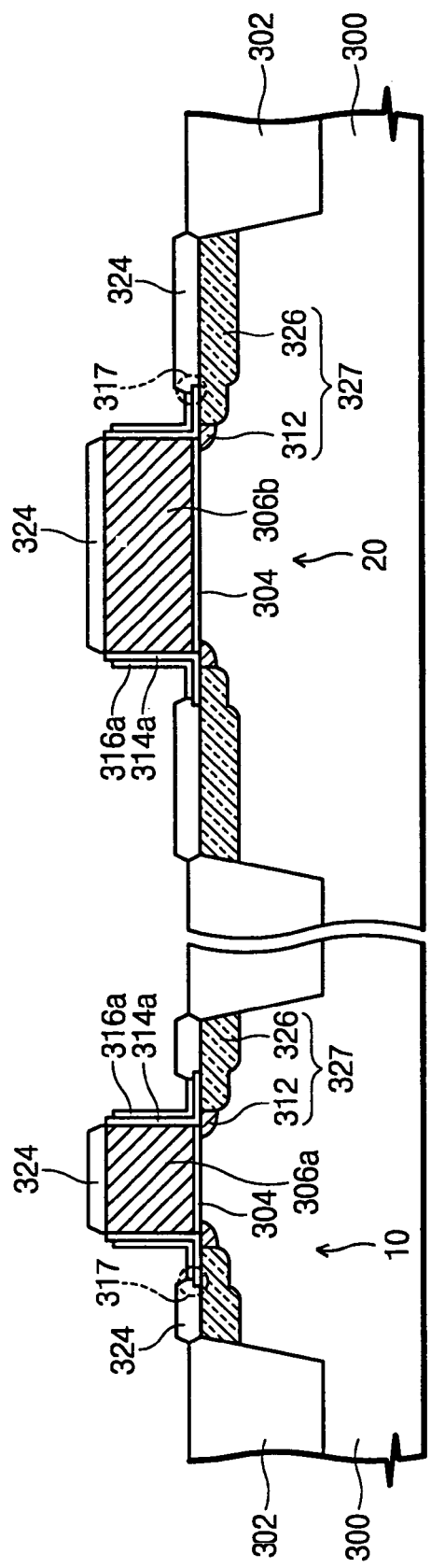

Referring to FIG. 16, the third insulating layer pattern 318a is isotropically etched to expose the second insulating layer pattern 316a. Preferably, the third insulating layer pattern 318a is etched by means of an isotropical etching technique using phosphoric acid solution. While the third insulating layer pattern 318a is etched, the edge of the second insulating layer pattern 316a is also etched to protrude the lateral edge of the first insulating layer pattern 314a from the lateral edge of the second insulating layer pattern 316a (317 in FIG. 16). A selective epitaxial growth (SEG) process is then performed to the semiconductor substrate, growing a silicon epitaxial layer 324 on top surfaces of the first and second gate electrodes 306a and 306b and on the first and second active regions 10 and 20. The silicon epitaxial layer 324 formed on the top surfaces thereof covers the lateral edge of the first insulating layer pattern 314a. A facet of a silicon epitaxial layer is disposed on the first insulating layer pattern 314a. Similar to the first embodiment, prior to formation of the silicon epitaxial layer 324, it is preferable to remove a native oxide layer that is formed on the exposed first and second active region 10 and 20 and on the first and second gate patterns 306a and 306b. For example, the SEG process may be performed shortly after an annealing process is performed at a temperature of 900° C. for about one minute while hydrogen flows onto a surface of the semiconductor substrate 300.

Using the first and second gate electrodes 306a and 306b as an ion implanting mask, a heavily doped diffusion layer 326 aligned to a vertical portion sidewall of the second insulating layer pattern 316a is formed in the first and second active regions 10 and 20. As a result, an LDD-structured source/drain 327 including a lightly doped diffusion layer 312 and a heavily doped diffusion layer 326 is formed in the first and second active regions 10 and 20 adjacent to the opposite sides of the first and second gate electrodes 306a and 306b. The heavily doped diffusion layer 326 may be formed prior to formation of the silicon epitaxial layer 324. In this case, the heavily doped diffusion layer 326 below the first and second insulating layer patterns 314a and 316a may be deeper than the heavily doped diffusion layer below the silicon epitaxial layer 324.

Figure 17:
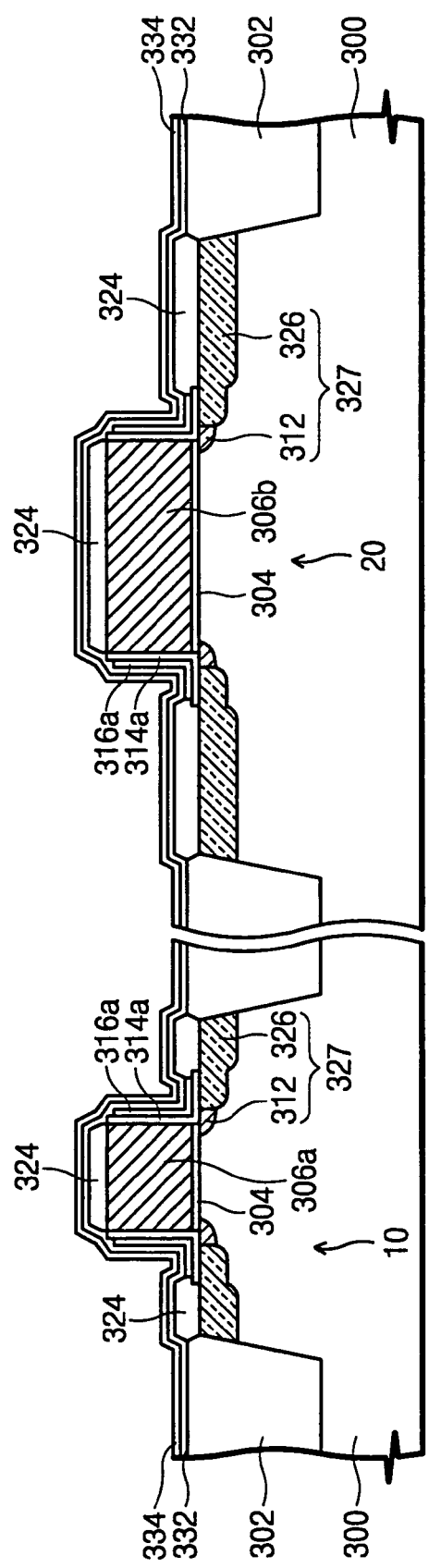

Referring to FIG. 17, first and second barrier insulating layers 332 and 334 are sequentially, conformally formed over an entire surface of the semiconductor substrate. The first barrier insulating layer 332 may be made of silicon oxide having a thickness of 100 angstroms, and the second barrier insulating layer 334 may be made of silicon nitride having a thickness of 10 angstroms.

Figure 18:
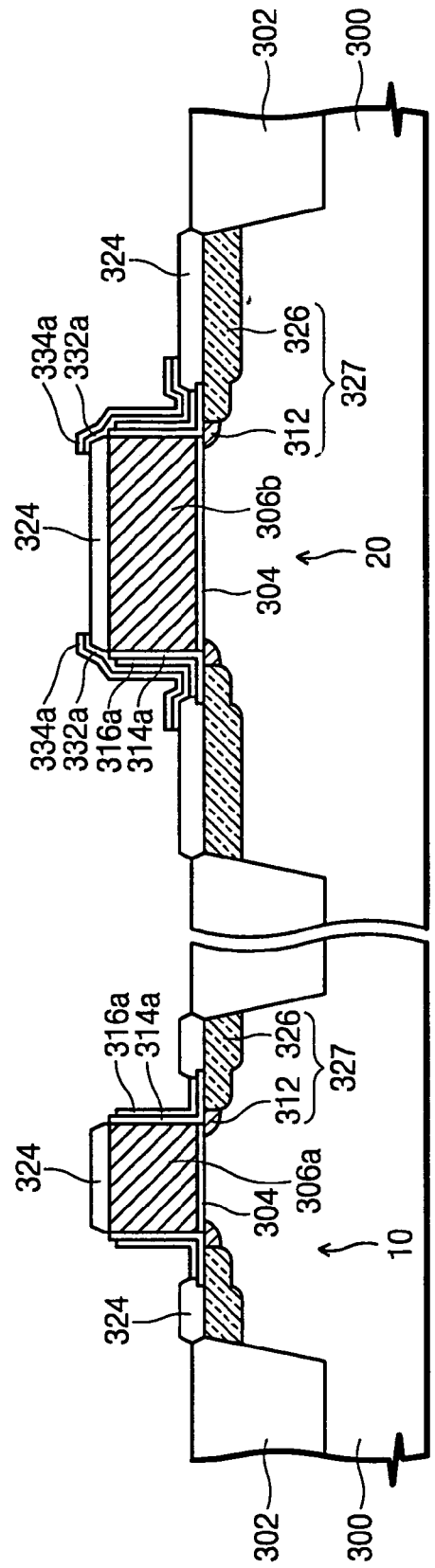

Referring to FIG. 18, the first and second barrier insulating layers 332 and 334 are sequentially patterned to form first and second barrier insulating layer patterns 332a and 334a which sequentially, conformally cover the L-shaped first and second insulating layer patterns 314a and 316a on the sidewall of the second gate electrode 306a. The first and second barrier insulating layer patterns 332a and 334a are laterally extended to cover a predetermined region of the silicon epitaxial layer 324.

Figure 19:
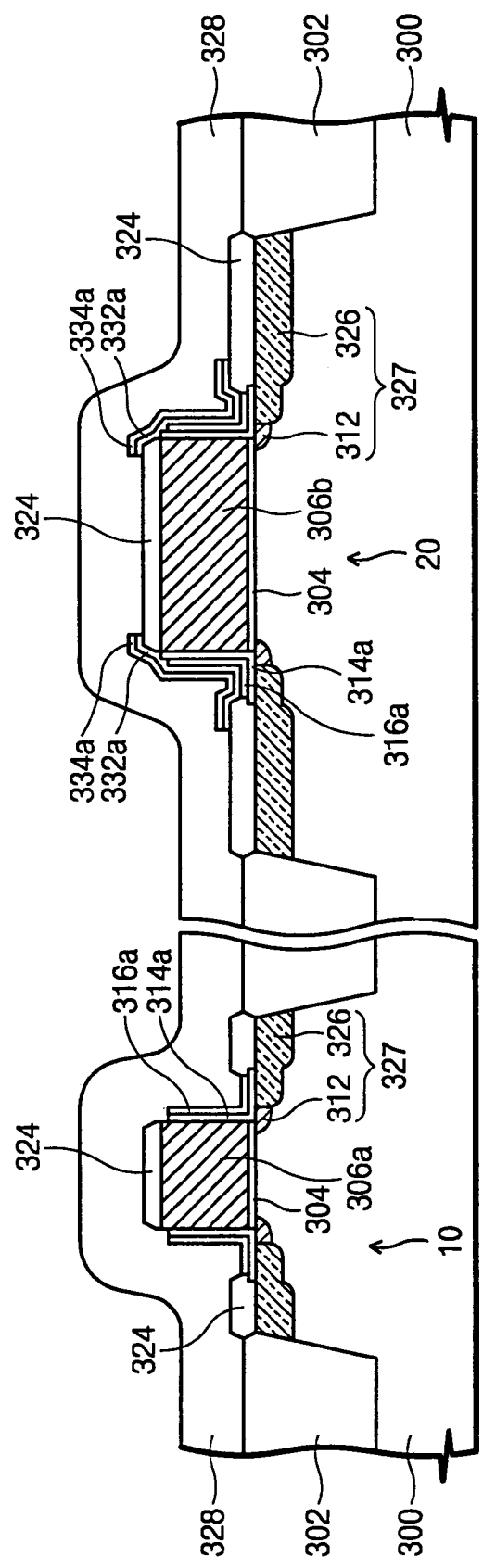

Referring to FIG. 19, a metal layer 328 is conformally formed over an entire surface of the semiconductor substrate. The metal layer 328 may be made of the same metal as stated in the first embodiment. Prior to formation of the metal layer 328, the native oxide layer grown on a top surface of the silicon epitaxial layer 324 is removed to expose an upper sidewall of the first gate electrode 306a.

Figure 20:
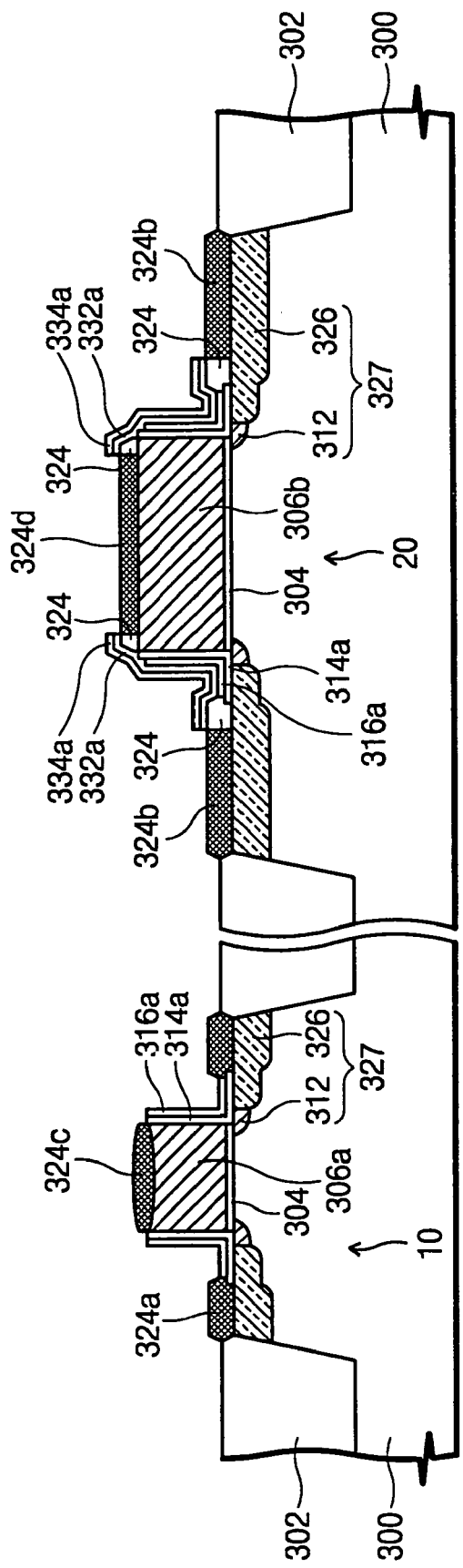

Referring to FIG. 20, similar to the first embodiment, the silicon epitaxial layer 324 is silicided to form first and second gate silicide layers 324c and 324d on the first and second gate electrodes 306a and 306b respectively, to form first source/drain silicide layers 324a and 324b adjacent to the edges of the first and second insulating layer patterns 314a and 316a on the first active region 10, and to form a second source/drain silicide layer 324b on the second active region. The first and second barrier insulating layer patterns 332a and 334a serves to prevent metal atoms from diffusing into the silicon epitaxial layer 324 during the silicidation process. Therefore, a sidewall of the second source/drain silicide layer 324b is aligned to the edges of the first and second barrier insulating layer patterns 332a and 334a. The second gate silicide layer 324d is aligned to the sidewalls of the first and second barrier insulating layer patterns 332a and 334a. As a result, the first source/drain silicide layer 324a on the first active region 10 and the second source/drain silicide layer 324b on the second active region 20 planarly contact the semiconductor substrate 300 to remarkably lower the concentration of an undesirable electric field.

Figure 21:
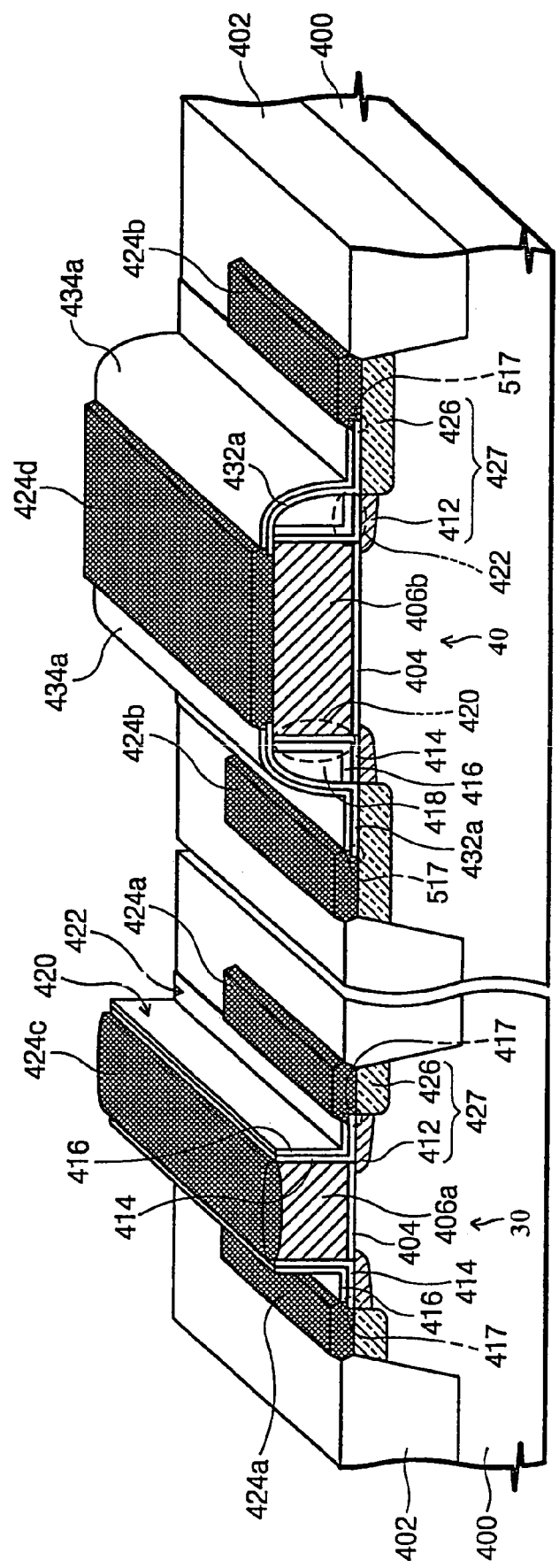
FIG. 21 is an isometric view illustrating a semiconductor device according to a third embodiment of the present invention.

An isometric view illustrating a semiconductor device according to a third embodiment of the present invention is shown in FIG. 21. Referring to FIG. 21, a device isolation layer 402 is formed at a predetermined region of a semiconductor substrate 400 to define first and second active regions 30 and 40. A transistor of an ESD protection circuit may be formed in the second active region 40. A first gate electrode 406a and a second gate electrode 406b cross over the first active region 30 and a second active region 40, respectively. A gate oxide layer is interposed between the first gate electrode 406a and the first active region 30 and between the second gate electrode 406b and the second active region 40. L-shaped first and second insulating layer patterns 414 and 416 are sequentially formed on a sidewall of the first gate electrode 406a, and a sidewall insulating layer pattern is formed on a sidewall of the second gate electrode 406b. The sidewall insulating layer pattern includes L-shaped first and second insulating layer patterns 414 and 416 and a third insulating layer pattern 418 having a curved sidewall. The sidewall insulating pattern is covered with first and second barrier insulating layer patterns 432a and 434a that are sequentially stacked. The first and second barrier insulating layer patterns 432a and 434a are extended to cover a predetermined region of the second active region 40 adjacent to the sidewall insulating layer pattern. The first and second barrier insulating layer patterns 432a and 434a are conformally formed. The L-shaped first and second insulating layer patterns 414 and 416 have a vertical portion 420 and a horizontal portion 422. A lateral edge of the L-shaped first insulating layer pattern 414 is protruded from a lateral edge of the L-shaped second insulating layer pattern 416. An edge of the first barrier insulating layer pattern 432a is protruded from an edge of the second barrier insulating layer pattern 434a.

A first gate silicide layer 424c is formed on the first gate electrode 406a. A first source/drain silicide layer 424a, which is adjacent the lateral edges of the first and second insulating layer patterns 414a and 416, are formed on the first active region 30. A second source drain silicide layer 424b, which is adjacent the edges of the first and second barrier insulating layer patterns 432a and 434a, is formed on the second active region 40. A second gate silicide layer 424d is formed on the second gate electrode 406b, and is disposed between the first and second barrier insulating layer patterns 432a and 434a adjacent opposite sides of the second gate electrode 406b.

An impurity-diffusing layer 427 is formed in the first and second active regions 30 and 40. The impurity-diffusing layer 427 formed in the active region 30 is aligned to the sidewall of the first gate electrode 406a, and the impurity-diffusing layer 427 formed in the second active region 40 is aligned to the sidewall of the second gate electrode 406b. The impurity-diffusing layer 427 includes a lightly doped diffusion layer 412 aligned to the sidewall of the first gate electrode 406a or the second gate electrode 406b and a heavily doped diffusion layer 426 aligned to the lateral edge of the first insulating layer pattern 414.

The first and second gate silicide layers 424c and 424d contact the first and second gate electrodes 406a and 406b, respectively. The first and second source/drain silicide layer 424a and 424b contact the semiconductor substrates of the first and second active regions 30 and 40, respectively. The first and second source/drain silicide layers 424a and 424b are silicided versions of a silicon layer grown by means of a selective epitaxial growth (SEG) process. A facet of a silicon epitaxial layer grown on the first active region 30 is disposed on the L-shaped first insulating layer pattern 414, and a facet of a silicon epitaxial layer grown on the second active region 40 is disposed on the first barrier insulating layer pattern 432a. Accordingly, the first source/drain silicide layer 424a can planarly contact the semiconductor substrate. Since the second source/drain silicide layer 424b is aligned to the edges of the first and second barrier insulating layer patterns 432a and 434a, it can planarly contact the semiconductor substrate of the second active region 40.

The third embodiment of the present invention is described below with reference to FIG. 22 through FIG. 25.

Figure 22:
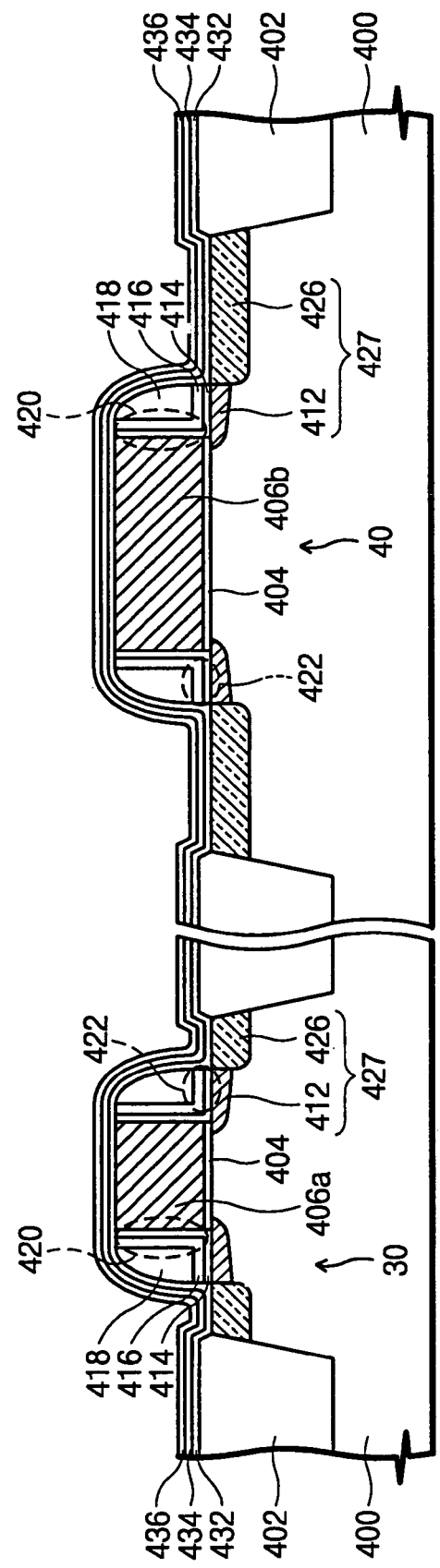
FIG. 22 through FIG. 25 are cross-sectional views illustrating a method of fabricating a semiconductor device according to the third embodiment of the present invention.

Referring to FIG. 22, similar to the second embodiment described with reference to FIG. 13 through FIG. 15, a device isolation layer 402 is formed at a semiconductor substrate 400 to define first and second active regions 30 and 40. First and second gate electrodes 406a and 406b are formed to cross over the first and second active regions 30 and 40, respectively. A lightly doped diffusion layer 412 is formed in the first and second active regions 30 and 40. The lightly doped diffusion layer 412 formed in the first active region 30 is aligned to a sidewall of the first gate electrode 406a, and the lightly doped diffusion layer 412 formed in the second active region 40 is aligned to a sidewall of the second gate electrode 406b. L-shaped first and second insulating layer patterns 414 and 416 and a third insulating layer 418 having a curved sidewall are sequentially stacked on the sidewalls of the first and second gate electrodes 406a and 406b. A heavily doped diffusion layer 426 is formed in the first and second active regions 30 and 40 to be aligned to an edge of the first insulating layer pattern 432. The lightly doped diffusion layer 412 and the heavily doped diffusion layer 426, which are adjacent a top surface of each active region, correspond to a source/drain 427 of a transistor. A first barrier insulating layer 432, a second barrier insulating layer 434, and a sacrificial insulating layer 436 are sequentially formed over an entire surface of a semiconductor substrate where the heavily doped diffusion layer 426 is formed. Preferably, the first barrier insulating layer 432, the second barrier insulating layer 434, and the sacrificial insulating layer 436 are made of silicon oxide, high temperature nitride (HTN), and low temperature nitride (LTN), respectively.

Figure 23:
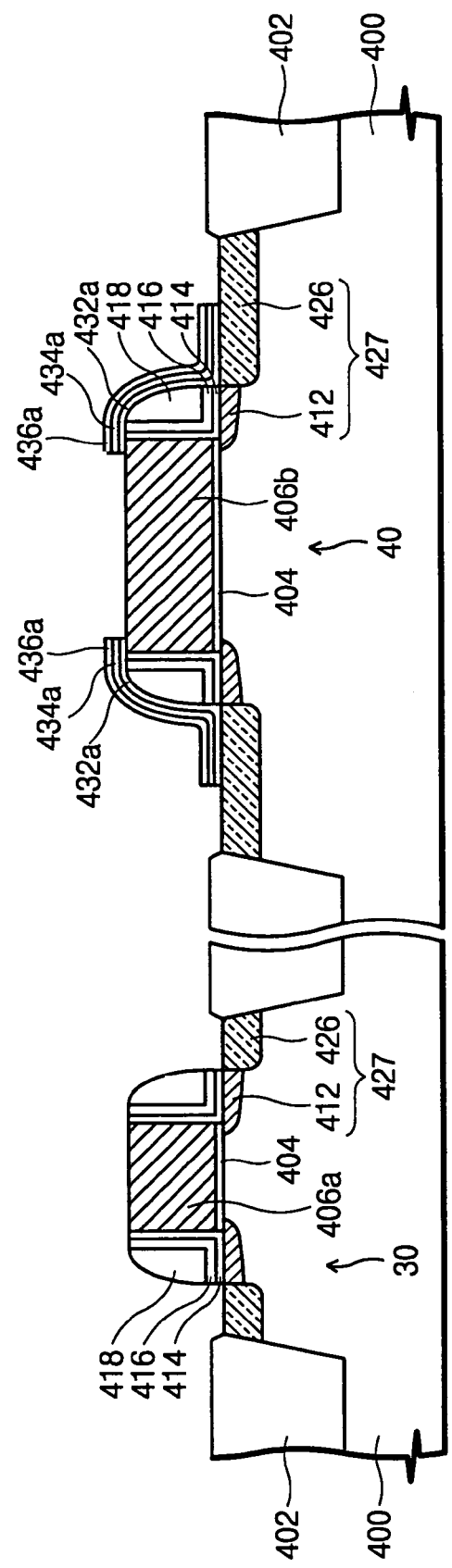

Referring to FIG. 23, the sacrificial insulating layer 436, the second barrier insulating layer 434, and the first barrier insulating layer 432 are sequentially patterned to form a first barrier insulating layer pattern 432a, a second barrier insulating layer pattern 434a, and a sacrificial insulating layer pattern 436a that are sequentially stacked on the first, second, and third insulating layer patterns 414, 416, and 418. In this case, the sequentially stacked first, second, and third insulating layer patterns 414, 416, and 418 are exposed. The first and second barrier insulating layer patterns 432a and 434a and the sacrificial insulating layer pattern 436a are laterally extended to cover a predetermined region of the second active region 40.

Figure 24:
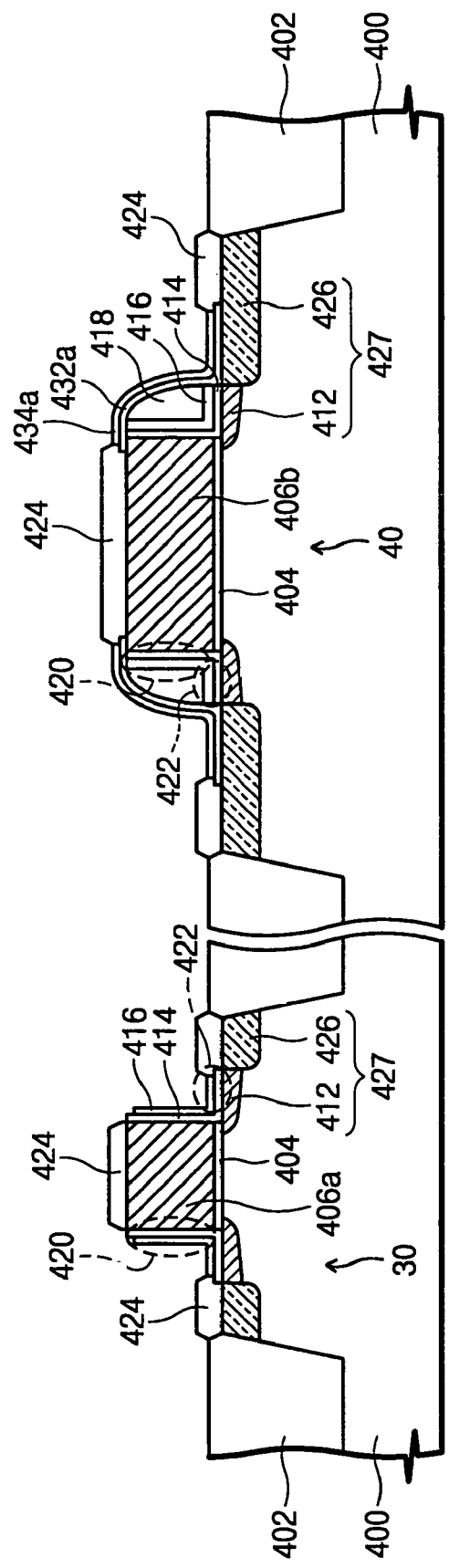

Referring to FIG. 24, the third insulating layer pattern 418 exposed on the active region 30 and the sacrificial insulating layer pattern 436a are isotropically etched. Preferably, they are etched by means of an isotropic etching technique using phosphoric acid solution. While they are etched, an edge of the L-shaped second insulating layer pattern 416 and an edge of the second barrier insulating layer pattern 434a are also etched to protrude an edge of the L-shaped first insulating layer pattern 414 from the edge of the second insulating layer pattern 416 and to protrude an edge of the first barrier insulating layer pattern 432a from the edge of the second barrier insulating layer pattern 434a, as shown in FIG. 24. A selective epitaxial growth (SEG) process is performed to the semiconductor substrate, growing a silicon epitaxial layer 424 on the first and second gate electrodes 406a and 406b and on the first and second active regions 30 and 40. The silicon epitaxial layer 424 formed on the first active region covers the edge of the horizontal portion 422 of the first insulating layer pattern 414. The silicon epitaxial layer 424 formed on the second active region covers the lateral edge of the first barrier insulating layer pattern 432a. Thus, a facet of the silicon epitaxial layer is disposed on the L-shaped first insulating layer pattern 414 or the first barrier insulating layer pattern 432a.

Figure 25:
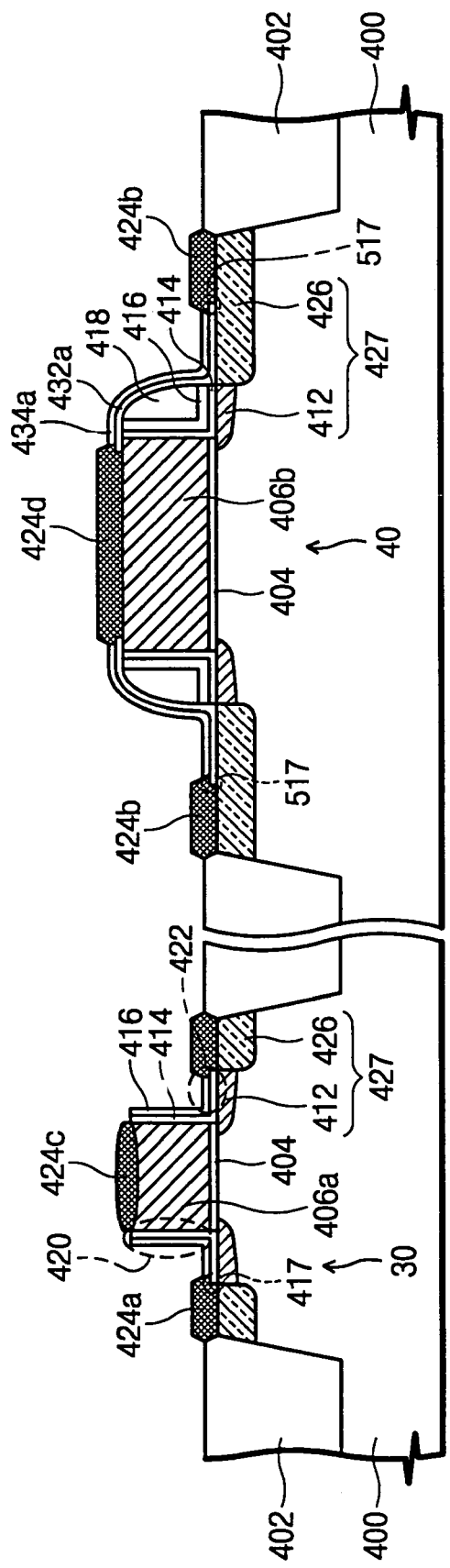

Referring to FIG. 25, similar to the first and second embodiments, a silicidation process is performed to silicide the silicon epitaxial layer 424. Accordingly, fist and second gate silicide layers 424c and 424d are formed on the first and second gate electrodes 406a and 406b, respectively. Further, first and second source/drain silicide layer 424a and 424b are formed on the first and second active regions 30 and 40, respectively. Thus, the first source/drain silicide layer 424a on the first active region and the second source/drain silicide layer 424b on the second active region planarly contact the semiconductor substrate to remarkably lower the concentration of an undesirable electric field. In addition, the second source/drain silicide layer 424b is apart a predetermined distance from the second gate electrode 406b. Thus, when ESD occurs, the heat in a transistor is decentralized to prevent a partial destruction of the transistor.

As described so far, using an L-shaped insulating layer pattern, a source/drain silicide layer planarly contact a semiconductor substrate. Thus, the concentration of an electric filed in a source/drain region is prevented to remarkably reduce a leakage current flowing to the substrate.

Further, a silicide layer is formed to intersect a gate electrode. The silicide layer has an upper area that is larger than an area contacting the source/drain, which makes it possible to prevent an increase inresistance caused by a misalignment of a contact plug coupled to the source/drain.

Further, a thickness of a silicide layer formed on a gate electrode is increased to reduce a signal delay (RC delay) of the gate electrode.

Further, a local thermal damage of a transistor junction in an ESD protection circuit is suppressed to fabricate a semiconductor substrate having an excellent resistance against an external electric shock.

The present invention is naturally not limited to the above described and the embodiments shown on the drawings, but can be modified within the scope of the appended claims.

What is claimed is:

1. A method of fabricating a semiconductor device, comprising:

defining an active region at a semiconductor substrate;

forming a gate electrode crossing over the active region;

sequentially stacking first and second insulating layer patterns on active regions adjacent to opposite sides of the gate electrode, wherein an edge of the first insulating layer pattern contacting the active region is protruded from an edge of the second insulating layer pattern;

forming a silicon epitaxial layer adjacent to the edges of the first and second insulating layer patterns on the active region, wherein the silicon epitaxial layer covers the protruded edge of the first insulating layer pattern and contacts the edge of the second insulating layer pattern; and siliciding at least a part of the silicon epitaxial layer.

2. The method of claim 1, wherein forming the first and second insulating layer patterns comprises:

conformally stacking first, second, and third insulating layers on an entire surface of a semiconductor substrate where the gate electrode is formed;

sequentially patterning the third, second, and first insulating layers to sequentially form first, second, and third insulating layer patterns on active regions adjacent to the opposite sides of the gate electrode; and removing the third insulating layer pattern and a predetermined region of the edge of the second insulating layer pattern by means of an isotropic etching technique, wherein the first insulating layer is made of material having an etch selectivity with respect to the second an third insulating layers, and the second insulating layer is made of material whose etching speed is lower than that of the third insulating layer.

3. The method of claim 2, wherein the first insulating layer is made of silicon oxide, and the second and third insulating layers are made of silicon nitride.

4. The method of claim 2, wherein the second insulating layer is made of high temperature nitride (HTN), and the third insulating layer is made of low temperature nitride (LTN) deposited at a lower temperature than that of the HTN.

5. The method of claim 4, wherein the second insulating layer is deposited at a lower pressure than that of the third insulating layer.

6. The method of claim 2, wherein the second insulating layer is made of silicon nitride, and the third insulating layer is made of silicon oxynitride.

7. The method of claim 1, further comprising forming an impurity-diffusing layer in active regions adjacent to the opposite sides of the gate electrode.

8. A method of fabricating a semiconductor device, comprising:
   defining an active region at a predetermined region of a semiconductor substrate;
   forming a gate electrode crossing over the active region;
   sequentially stacking L-shaped first and second insulating layer patterns on a sidewall of the gate electrode, wherein each of the first and second insulating layer patterns has a vertical portion and a horizontal portion, and a lateral edge of the first insulating layer pattern is protruded from a lateral edge of the second insulating layer pattern;
   selectively growing a silicon epitaxial layer on an active region exposed at the sides of the first and second insulating layer patterns to cover the protruded lateral edge of the first insulating layer pattern and to contact an edge of the second insulating layer pattern; and
   siliciding the silicon epitaxial layer to form a source/drain silicide layer on the active region and concurrently to form a gate silicide layer on a top of the gate electrode, wherein the source/drain silicide layer planarly contacts a surface of a semiconductor substrate within the active region.

9. The method of claim 8, further comprising forming a lightly doped diffusion layer in active regions adjacent to opposite sides of the gate electrode following formation of the gate electrode.

10. The method of claim 8, wherein forming the L-shaped first and second insulating layer patterns comprises:
    sequentially forming first, second, and third insulating layers on an entire surface of a semiconductor substrate where the gate electrode is formed;
    sequentially anisotropically etching the third, second, and first insulating layers to form an L-shaped first insulating layer pattern, an L-shaped second insulating layer pattern, and a third insulating layer which are sequentially cover the sidewall of the gate electrode; and
    isotropically etching the third insulating layer pattern to expose the second insulating layer pattern and concurrently etching the lateral edge of the second insulating layer pattern.

11. The method of claim 10, wherein the first insulating layer is made of silicon oxide.

12. The method of claim 11, wherein the second insulating layer is made of high temperature nitride (HTN), and the third insulating layer is made of low temperature nitride (LTN) deposited at a lower temperature than that of the HTN.

13. The method of claim 11, wherein the second insulating layer is made of silicon nitride, and the third insulating layer is made of silicon oxynitride.

14. The method of claim 8, further comprising exposing an upper sidewall of the gate electrode prior to silicidation of the silicon epitaxial layer, wherein the exposed upper sidewall of the gate electrode is also silicided in forming the silicide layer.

15. The method of claim 8, further comprising:
    sequentially conformally forming first and second barrier insulating layers on an entire surface of a semiconductor substrate where the silicon epitaxial layer is formed; and
    sequentially patterning the second and first barrier insulating layers to form first and second barrier insulating layer patterns which are sequentially stacked to cover the L-shaped first and second insulating layer patterns while uncovering the predetermined region of the silicon epitaxial layer adjacent to the opposite sides of the gate electrode and the predetermined region of the silicon epitaxial layer on the gate electrode,
    wherein when siliciding the silicon epitaxial layer, the first and second barrier insulating layer patterns prevent silicidation of the underlying silicon epitaxial layer.

16. The method of claim 8, further comprising implanting impurities into a semiconductor substrate adjacent to the opposite sides of the gate electrode to form a heavily doped diffusion layer whose depth is lower at an active region outside the first insulating layer pattern than at a bottom of the first insulating layer pattern.

17. The method of claim 8, further comprising implanting impurities into the active region adjacent to the opposite sides of the gate electrode to form a heavily doped diffusion layer below the first insulating layer pattern and in the active region below the epitaxial layer.

18. The method of claim 8, further comprising removing the exposed gate electrode and a native oxide layer on a surface of the exposed active region before forming the silicon epitaxial layer.

19. The method of claim 8, wherein forming the gate silicide layer and the source/drain silicide layer comprises:
    forming a metal layer on an entire surface of a semiconductor substrate where the silicon epitaxial layer is formed;
    performing a first annealing process for a semiconductor substrate where the metal layer is formed, whereby diffusing metal atoms into the epitaxial layer;
    removing an atom-diffused metal layer; and
    performing a second annealing process for the semiconductor substrate to silicide the epitaxial layer.

20. The method of claim 19, wherein the atom-diffused metal layer is removed by means of an isotropic etching technique.

21. A method of fabricating a semiconductor device, comprising:
    defining an active region at a predetermined region of a semiconductor substrate;
    forming a gate electrode crossing over the active region;
    forming a sidewall insulating layer pattern on a sidewall of the gate electrode;
    sequentially stacking first and second barrier insulating layer patterns to conformally cover the sidewall insulating layer pattern and a predetermined region of the active region, wherein an edge of the first barrier insulating layer pattern on the active region is protruded from an edge of the second barrier insulating layer pattern;
    growing an epitaxial layer on the gate electrode exposed to opposite sides of the barrier insulating layer patterns and the active region to cover the protruded edge of the first insulating layer pattern; and siliciding the epitaxial layer to form a source/drain silicide layer planarly contacting a semiconductor substrate within the active region and a gate silicide layer planarly contacting the gate electrode.

22. The method of claim 21, wherein stacking the first and second barrier insulating layer patterns comprises:
sequentially conformally forming a first barrier insulating layer, a second barrier insulating layer, and a sacrificial insulating layer on an entire surface of a semiconductor substrate where the sidewall insulating layer pattern is formed;
sequentially patterning the sacrificial insulating layer, the second barrier insulating layer, and the first barrier insulating layer to form a first barrier insulating layer pattern, a second barrier insulating layer pattern, and a sacrificial insulating layer pattern which are sequentially stacked to cover the sidewall insulating layer pattern and a predetermined region of the active region; and
isotropically etching the sacrificial insulating layer pattern and concurrently etching the edge of the second barrier insulating layer pattern to expose the edge of the first barrier insulating layer pattern.

23. The method of claim 22, wherein the first barrier insulating layer is made of silicon oxide, and the second barrier insulating layer and the sacrificial insulating layer are made of silicon nitride.

24. The method of claim 22, wherein the second barrier insulating layer is made of high temperature nitride (HTN), and the sacrificial insulating layer is made of low temperature nitride (LTN) deposited at a lower temperature than that of the HTN.

25. The method of claim 24, wherein the second barrier insulating layer is deposited at a low pressure, as compared to the sacrificial insulating layer.

26. The method of claim 22, wherein the second insulating layer is made of silicon nitride, and the sacrificial insulating layer is made of silicon oxynitride.

27. The method of claim 21, wherein in forming the silicon epitaxial layer, the silicon epitaxial layer is also formed at a predetermined region on the gate electrode.

28. The method of claim 21, further comprising forming an impurity-diffusing layer in the active regions adjacent to the opposite sides of the gate electrode.

29. The method of claim 28, wherein the impurity-diffusing layer includes:
a lightly doped diffusion layer formed in an active region below the sidewall spacer; and
a heavily doped diffusion layer which is formed in an active region below the first barrier insulating layer pattern and the source/drain silicide layer and is adjacent to the lightly doped diffusion layer.

30. A method of fabricating a semiconductor device, comprising:
defining first and second active regions at a semiconductor substrate;
forming a first gate electrode crossing the first active region and a second gate electrode crossing the second active region;
forming L-shaped first and second insulating layers that are sequentially stacked on each sidewall of the first and second gate electrodes, wherein each of the first and second insulating layers has a vertical portion and a horizontal portion, and a lateral edge of the first insulating layer contacting the first and second active region is protruded from a lateral edge of the second insulating layer pattern;
growing a silicon epitaxial layer on the first and second gate electrodes and the first and second active regions exposed at a side of the L-shaped first insulating layer to cover the protruded lateral edge of the L-shaped first insulating layer;
forming first and second barrier insulating layer patterns that are sequentially stacked on the second active region, the first and second barrier insulating layer patterns conformally covering a first portion of the silicon epitaxial layer on the second active region while exposing a second portion of the silicon epitaxial layer on the second region; and
siliciding the silicon epitaxial layer using the first and second barrier insulating layer patterns as a mask to form a first source/drain silicide layer, a second source/drain silicide layer, a first gate silicide layer, and a second gate silicide layer on the first active region, a part of the second active region, the first gate electrode, and the second gate electrode, respectively.

31. The method of claim 30, after forming the first and second gate electrodes, further comprising forming a lightly doped diffusion layer in active regions adjacent to opposite sides of the first and second gate electrodes.

32. The method of claim 30, wherein forming the L-shaped first and second insulating layer patterns comprises:
sequentially forming first, second, and third insulating layers on an entire surface of a semiconductor substrate where the first and second gate electrodes are formed;
anisotropically etching the third, second, and first insulating layers to form an L-shaped first insulating layer pattern, an L-shaped second insulating layer pattern, and a third insulating layer pattern that sequentially cover the sidewall of the gate electrode, wherein the third insulating layer has a curved sidewall; and
isotropically etching the third insulating layer pattern to expose the second insulating layer and concurrently etching a part of the lateral edge of the second insulating layer pattern.

33. The method of claim 32, wherein the first insulating layer is made of silicon oxide.

34. The method of claim 32, wherein the second insulating layer is made of high temperature nitride (HTN), and the third insulating layer is made of low temperature nitride (LTN) deposited at a lower temperature than that of the HTN.

35. The method of claim 32, wherein the second insulating layer is made of silicon nitride, and the third insulating layer is made of silicon oxynitride.

36. The method of claim 31, before siliciding the silicon epitaxial layer, further comprising exposing an upper sidewall of the first gate electrode, wherein a top of the exposed first gate electrode is also silicided while forming the silicide layer.

37. The method of claim 31, wherein the first barrier insulating layer pattern is made of silicon oxide, and the second barrier insulating layer pattern is made of silicon nitride.

38. The method of claim 30, before forming the silicon epitaxial layer, further comprising implanting impurities into a semiconductor substrate adjacent to the opposite sides of the first and second gate electrodes to form a heavily doped diffusion layer.

39. The method of claim 30, after forming the silicon epitaxial layer, further comprising implanting impurities into a semiconductor substrate adjacent to the opposite sides of the first and second gate electrodes to form a heavily doped diffusion layer in a semiconductor substrate below the first insulating layer pattern and the epitaxial layer.

40. A method of fabricating a semiconductor device, comprising:

defining first and second active regions at a predetermined region of a semiconductor substrate;

forming a first gate electrode crossing the first active region and a second gate electrode crossing the second active region;

forming a sidewall insulating layer pattern covering each sidewall of the first and second gate electrodes, wherein the sidewall insulating layer pattern includes an L-shaped first insulating layer pattern, an L-shaped second insulating layer pattern, and a third insulating layer pattern that sequentially cover each sidewall of the first and second gate electrodes, and wherein the third insulating layer pattern has a curved sidewall;

forming first and second barrier insulating layer patterns and a sacrificial insulating layer pattern that are sequentially stacked to conformally cover the sidewall insulating layer pattern adjacent to the opposite sides of the second gate electrode and a predetermined region of the second active region;

isotropically etching the third insulating layer pattern adjacent to the opposite sides of the first gate electrode and the sacrificial insulating layer pattern adjacent to the opposite sides of the second gate electrode, and concurrently etching a part of an edge of the second insulating layer pattern and a part of an edge of the second barrier insulating layer pattern to protrude an edge of the first barrier insulating layer pattern from the edge of the second barrier insulating layer pattern;

performing a selective epitaxial growth (SEG) process for the semiconductor substrate to form a silicon epitaxial layer on top surfaces of the first and second gate electrodes and on the exposed first and second active regions adjacent to the opposite sides of the first and second gate electrodes; and siliciding the epitaxial layer to form a first source/drain silicide layer, a second source/drain silicide layer, a first gate silicide layer, and a second gate silicide layer on the first active region, the second active region, the first gate electrode, and the second gate electrode, respectively.

41. The method of claim 40, wherein forming the first and second barrier insulating layer patterns comprises:

sequentially conformally forming a first barrier insulating layer, a second barrier insulating layer, and a sacrificial insulating layer on an entire surface of a semiconductor substrate where the sidewall insulating layer pattern is formed; and sequentially patterning the sacrificial insulating layer, the second barrier insulating layer, and the first barrier insulating layer to form a first barrier insulating layer pattern, a second barrier insulating layer pattern, and a sacrificial insulating layer pattern which are sequentially stacked to cover the sidewall insulating layer pattern and a predetermined region of the active region.

42. The method of claim 41, wherein the first barrier insulating layer is made of silicon oxide, and the second barrier insulating layer and the sacrificial insulating layer are made of silicon nitride.

43. The method of claim 41, wherein the second barrier insulating layer is made of high temperature nitride (HTN), and the sacrificial insulating layer is made of low temperature nitride (LTN) deposited at a lower temperature than that of the HTN.

44. The method of claim 42, wherein the second barrier insulating layer is deposited at a low pressure, as compared to the sacrificial insulating layer.

45. The method of claim 41, wherein the second insulating layer is made of silicon nitride, and the sacrificial insulating layer is made of silicon oxynitride.

46. The method of claim 40, further comprising forming an impurity-diffusing layer in the active regions adjacent to the opposite sides of the gate electrode.

47. The method of claim 46, wherein the impurity-diffusing layer includes:

a lightly doped diffusion layer formed in an active region below the sidewall spacer; and a heavily doped diffusion layer which is formed in an active region below the first barrier insulating layer pattern and the source/drain silicide layer and is adjacent to the lightly doped diffusion layer.

48. The method of claim 40, wherein the first insulating layer pattern is made of silicon oxide.

49. The method of claim 40, wherein the second insulating layer is made of high temperature nitride (HTN), and the third insulating layer is made of low temperature nitride (LTN) deposited at a lower temperature than that of the HTN.

50. The method of claim 40, wherein the second insulating layer is made of silicon nitride, and the third insulating layer is made of silicon oxynitride.

* * * * *

UNITED STATES PATENT AND TRADEMARK OFFICE
CERTIFICATE OF CORRECTION

PATENT NO. : 7,172,944 B2 Page 1 of 1
APPLICATION NO. : 11/282156
DATED : February 6, 2007
INVENTOR(S) : Hyung-Shin Kwon It is certified that error appears in the above-identified patent and that said Letters Patent is hereby corrected as shown below:

Column 2, line 23, the words "106, A facet" should read -- 106. A facet --.

Signed and Sealed this

Twenty-eighth Day of July, 2009

JOHN DOLL
*Acting Director of the United States Patent and Trademark Office*